United States Patent
Shen et al.

(10) Patent No.: US 11,133,304 B2
(45) Date of Patent: Sep. 28, 2021

(54) PACKAGING SCHEME INVOLVING METAL-INSULATOR-METAL CAPACITOR

(71) Applicant: Taiwan Semiconductor Manufacturing Co., Ltd., Hsin-Chu (TW)

(72) Inventors: Hsiang-Ku Shen, Hsinchu (TW); Ying-Ju Chen, Yunlin County (TW); Hsien-Wei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 33 days.

(21) Appl. No.: 16/697,797

(22) Filed: Nov. 27, 2019

(65) Prior Publication Data
US 2021/0159224 A1 May 27, 2021

(51) Int. Cl.
*H01L 23/64* (2006.01)
*H01L 27/06* (2006.01)
*H01L 23/522* (2006.01)
*H01L 23/00* (2006.01)
*H01L 23/48* (2006.01)
(Continued)

(52) U.S. Cl.
CPC .... *H01L 27/0688* (2013.01); *H01L 21/76898* (2013.01); *H01L 21/78* (2013.01); *H01L 23/481* (2013.01); *H01L 23/5223* (2013.01); *H01L 23/5226* (2013.01); *H01L 23/5384* (2013.01); *H01L 23/642* (2013.01); *H01L 24/08* (2013.01); *H01L 24/80* (2013.01); *H01L 25/0657* (2013.01); *H01L 25/50* (2013.01); *H01L 28/60* (2013.01); *H01L 28/75* (2013.01);
(Continued)

(58) Field of Classification Search
CPC ............. H01L 21/76898; H01L 23/481; H01L 23/5223; H01L 23/5226; H01L 23/5384; H01L 23/642; H01L 24/08; H01L 24/80; H01L 2224/08415; H01L 2224/80357; H01L 25/0657; H01L 25/072; H01L 25/50; H01L 2225/06544; H01L 28/60; H01L 28/75
See application file for complete search history.

(56) References Cited

U.S. PATENT DOCUMENTS 7,564,115 B2   7/2009  Chen et al.
7,633,165 B2  12/2009  Hsu et al.
(Continued)

*Primary Examiner* — Stephen W Smoot
(74) *Attorney, Agent, or Firm* — Haynes and Boone, LLP

(57) ABSTRACT

A device includes a first die and a second die. The first die includes: a first substrate that contains first electrical circuitry, a first interconnection structure disposed over the first substrate, a first dielectric layer disposed over the first interconnection structure, and a plurality of first bonding pads disposed over the first dielectric layer. The second die includes: a second substrate that contains second electrical circuitry, a second interconnection structure disposed over the second substrate, a second dielectric layer disposed over the second interconnection structure, and a plurality of second bonding pads disposed over the second dielectric layer. The first bonding pads of the first die are bonded to the second bonding pads of the second die. At least one of the first die or the second die includes a metal-insulator-metal (MIM) capacitor. The MIM capacitor includes more than two metal layers that are stacked over one another.

20 Claims, 24 Drawing Sheets

(51) Int. Cl.
*H01L 49/02* (2006.01)
*H01L 21/78* (2006.01)
*H01L 25/065* (2006.01)
*H01L 25/00* (2006.01)
*H01L 23/538* (2006.01)
*H01L 21/768* (2006.01)

(52) U.S. Cl.
CPC .............. *H01L 2224/08145* (2013.01); *H01L 2224/80357* (2013.01); *H01L 2225/06544* (2013.01)

(56) References Cited

U.S. PATENT DOCUMENTS

| | | | |
|---|---|---|---|
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 2014/0001645 A1 | 1/2014 | Cheng et al. | |
| 2014/0097890 A1* | 4/2014 | Li | H01L 23/481 327/551 |
| 2014/0225258 A1 | 8/2014 | Wei et al. | |
| 2014/0252572 A1 | 9/2014 | Yun et al. | |
| 2015/0102395 A1* | 4/2015 | Park | H01L 29/66181 257/301 |
| 2016/0020268 A1* | 1/2016 | Suwada | H01L 23/5223 257/532 |
| 2016/0043060 A1* | 2/2016 | Kabe | H01L 24/08 257/774 |
| 2018/0240860 A1* | 8/2018 | Yang | H01L 24/09 |
| 2019/0074349 A1* | 3/2019 | Lin | H01L 27/016 |
| 2019/0115323 A1* | 4/2019 | Haba | H01L 24/80 |
| 2019/0228908 A1* | 7/2019 | Gambino | H01G 4/008 |
| 2019/0304935 A1* | 10/2019 | Collins | H01L 23/5286 |
| 2020/0091063 A1* | 3/2020 | Chen | H01L 24/80 |

* cited by examiner

PACKAGING SCHEME INVOLVING METAL-INSULATOR-METAL CAPACITOR

BACKGROUND

The semiconductor integrated circuitry (IC) industry has experienced rapid growth. Technological advances in IC design and material have produced generations of ICs where each generation has smaller and more complex circuits than previous generations. During the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, existing processes for forming capacitor devices in IC chips have not been sufficiently simple or cheap. Therefore, although existing semiconductor fabrication methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
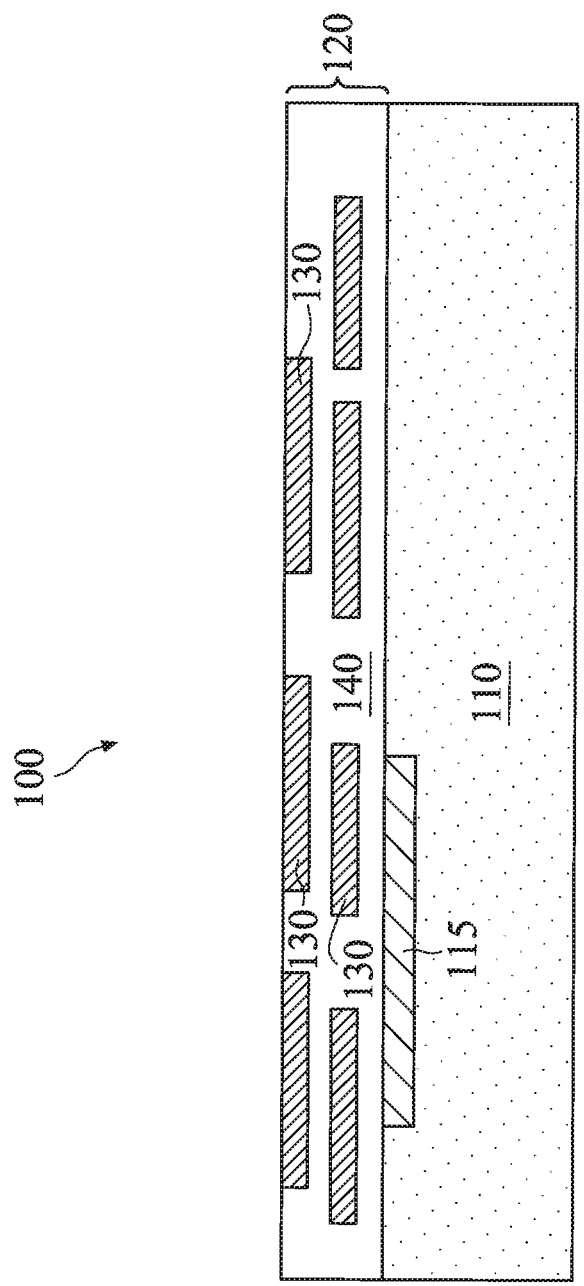
FIGS. 1-23 are sectional side views of an integrated circuitry (IC) device (or portions thereof) at various fabrication stages constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Integrated Circuitry (IC) chips contain a plurality of different types of microelectronic components, such as transistors, resistors, inductors, capacitors, etc. For each of these types of microelectronic components, there may be a variety of methods of fabrication, resulting in different structures thereof. The present disclosure involves a unique type of capacitor—referred to as a super high-density metal-insulator-metal (SHDMIM) capacitor—and how it is integrated into a packaging scheme such as a Small Outline Integrated Circuitry (SOIC), as discussed below in more detail with reference to FIGS. 1-24.

FIGS. 1-9 illustrate a series of diagrammatic fragmentary cross-sectional side view drawings of an IC structure 100 (or a work piece) constructed according to various aspects of the present disclosure in one embodiment. Referring now to FIG. 1, the IC structure 100 includes an IC substrate 110. In some embodiments, the IC substrate 110 includes a semiconductor substrate, such as a silicon substrate. The IC substrate 110 may also include various devices, such as field-effect transistors (FETs), memory cells, imaging sensors, passive devices, other devices, or combinations thereof. In some embodiments, the IC substrate 110 includes flat active regions with various IC devices, such as plain field-effect transistors (FETs). In some other embodiments, the IC substrate 110 includes fin (e.g., vertically protruding) active regions with various IC devices formed thereon. As a non-limiting example, electrical circuitry 115 is shown as being formed in the IC substrate 110 in FIG. 1. The electrical circuitry 115 may include planar type transistors or FinFET type transistors.

The IC structure 100 also includes an interconnection structure 120 formed over the semiconductor substrate. The interconnection structure 120 includes various conductive components, such as metal lines (e.g., metal lines 130), contacts, and vias, to provide horizontal and vertical electrical routing. The metal lines such as the metal lines 130 are distributed in multiple metal layers, such as a first metal layer (e.g., a M1 layer), a second metal layer (e.g., a M2 layer), . . . and a top metal layer. Among other things, the conductive components of the interconnection structure 120 may provide electrical connectivity to the electrical circuitry 115. The interconnection structure 120 also includes a dielectric material 140 to provide electrical isolation among the various conductive components, so as to prevent electrical shorting.

Figure 2:
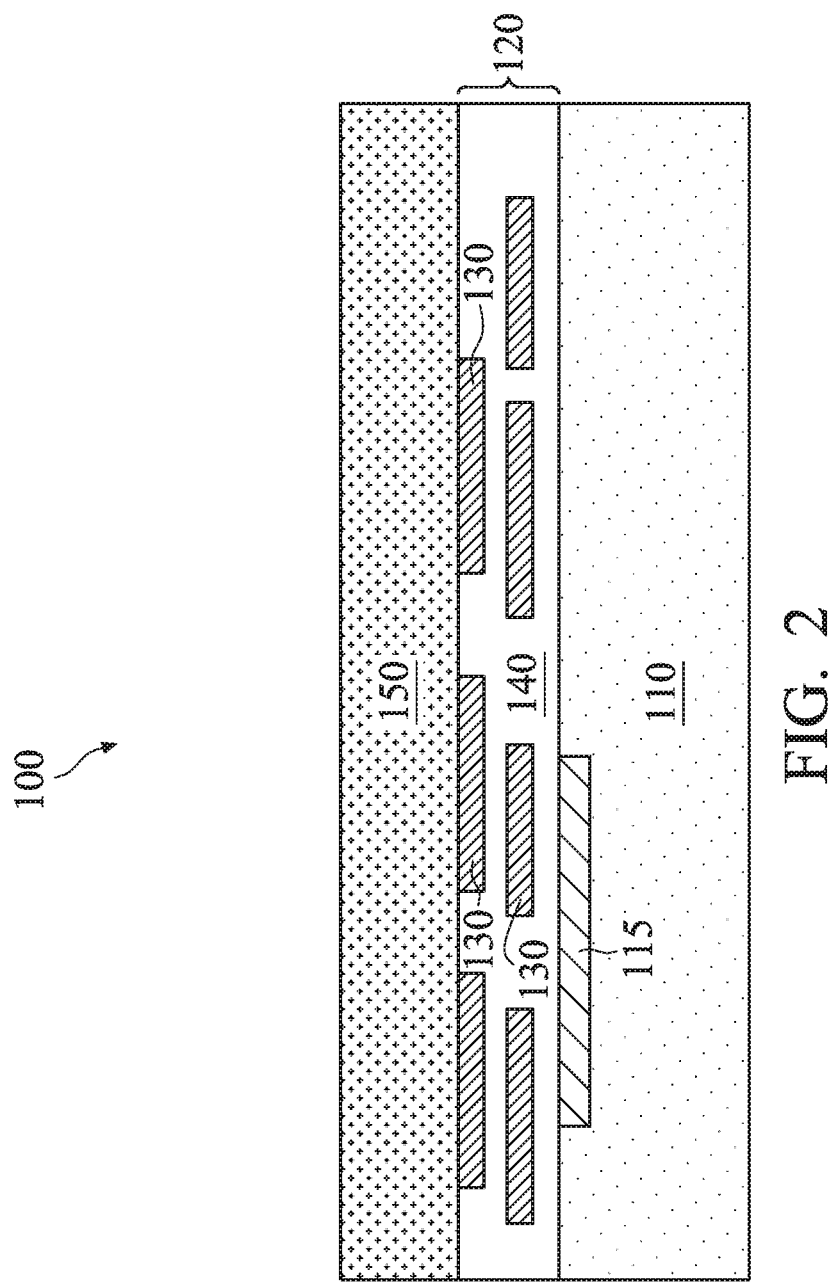

Referring now to FIG. 2, a passivation film 150 is formed over the interconnection structure 120, for example over a top metal layer of the interconnection structure 120. The passivation film 150 may provide protection to the IC substrate 110. In some embodiments, the passivation film 150 includes a silicon nitride (SiN) film and an un-doped silica glass (USG) film on the SiN film. These films are formed by suitable deposition techniques, such as by high density plasma chemical vapor deposition (HDPCVD), etc.

Figure 3:
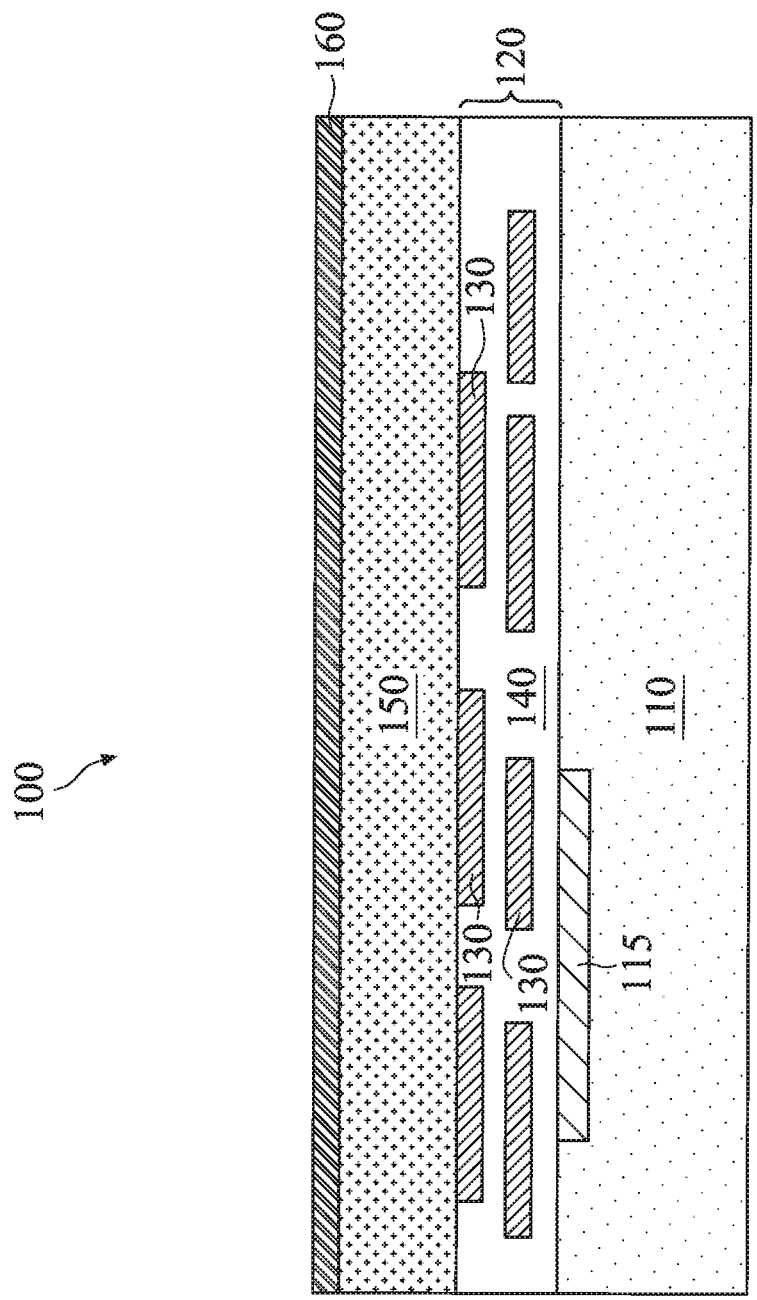

Referring now to FIG. 3, a conductive layer 160 is formed over the passivation film 150. In some embodiments, the conductive layer 160 includes a metal, a metal alloy, or a metal compound. For example, the conductive layer 160 may include titanium nitride. The conductive layer 160 may be formed using one or more deposition processes, such as chemical vapor deposition (CVD), physical vapor deposition (PVD), atomic layer deposition (ALD), or combinations thereof. It is understood that portions of this conductive layer 160 will serve as one of the electrodes (or one of the conductive plates) of the SHDMIM capacitor of the present disclosure.

Figure 4:
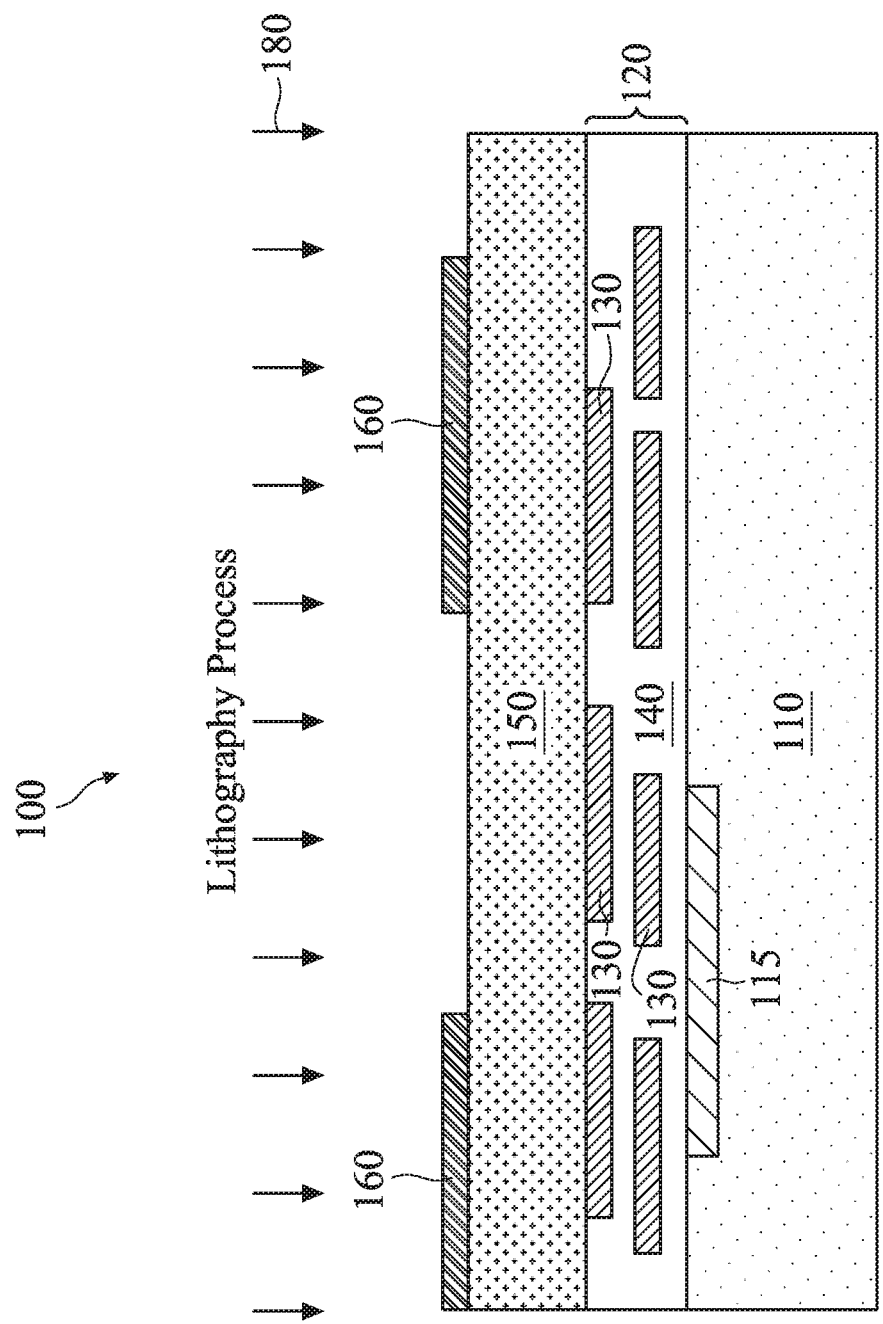

Referring now to FIG. 4, a lithography process 180 is performed to pattern the conductive layer 160. As a part of the lithography process 180, a patterned photoresist layer may be formed over the conductive layer 160. Using the patterned photoresist layer as a mask, the conductive layer 160 may be etched. Portions of the conductive layer 160 not protected by the patterned photoresist layer are etched away, while portions of the conductive layer 160 located underneath patterned photoresist layer are protected and remain after the etching process is performed. The remaining portions of the conductive layer 160 may serve as the electrodes or conductive plates of the SHDMIM capacitor.

Figure 5:
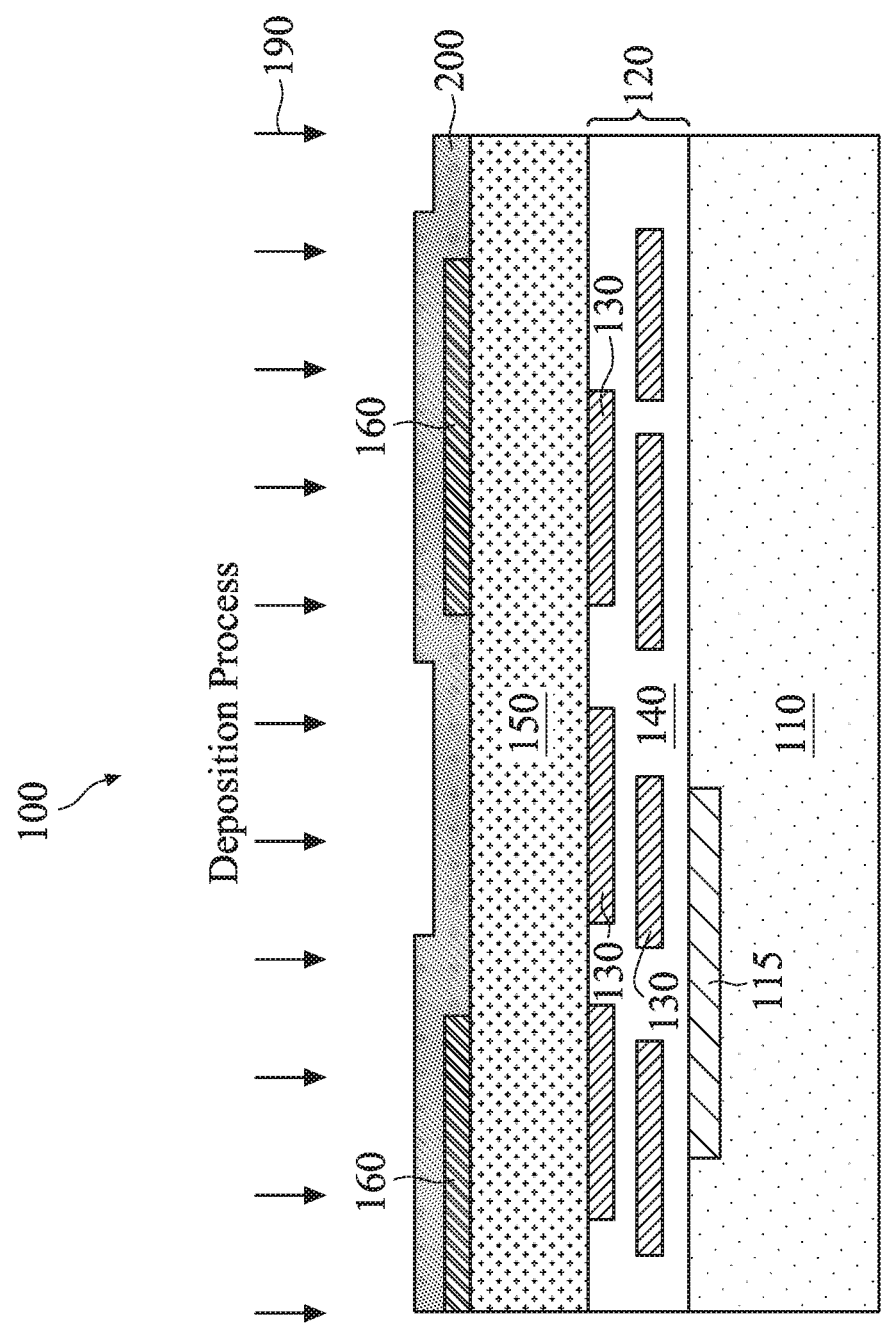

Referring now to FIG. 5, a deposition process 190 is performed to deposit a dielectric layer 200 over the remaining portions of the conductive layer 160 and over the exposed surfaces of the passivation film 150. The deposition process 190 may include CVD, PVD, ALD, or combinations thereof. In some embodiments, the dielectric layer 200 may include a dielectric material with a high-k dielectric constant. For example, a high-k dielectric material may be a dielectric material with a dielectric constant greater than about 4 (e.g., greater than that of silicon oxide). Suitable candidates for the high-k dielectric materials include, but are not limited to: hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

Figure 6:
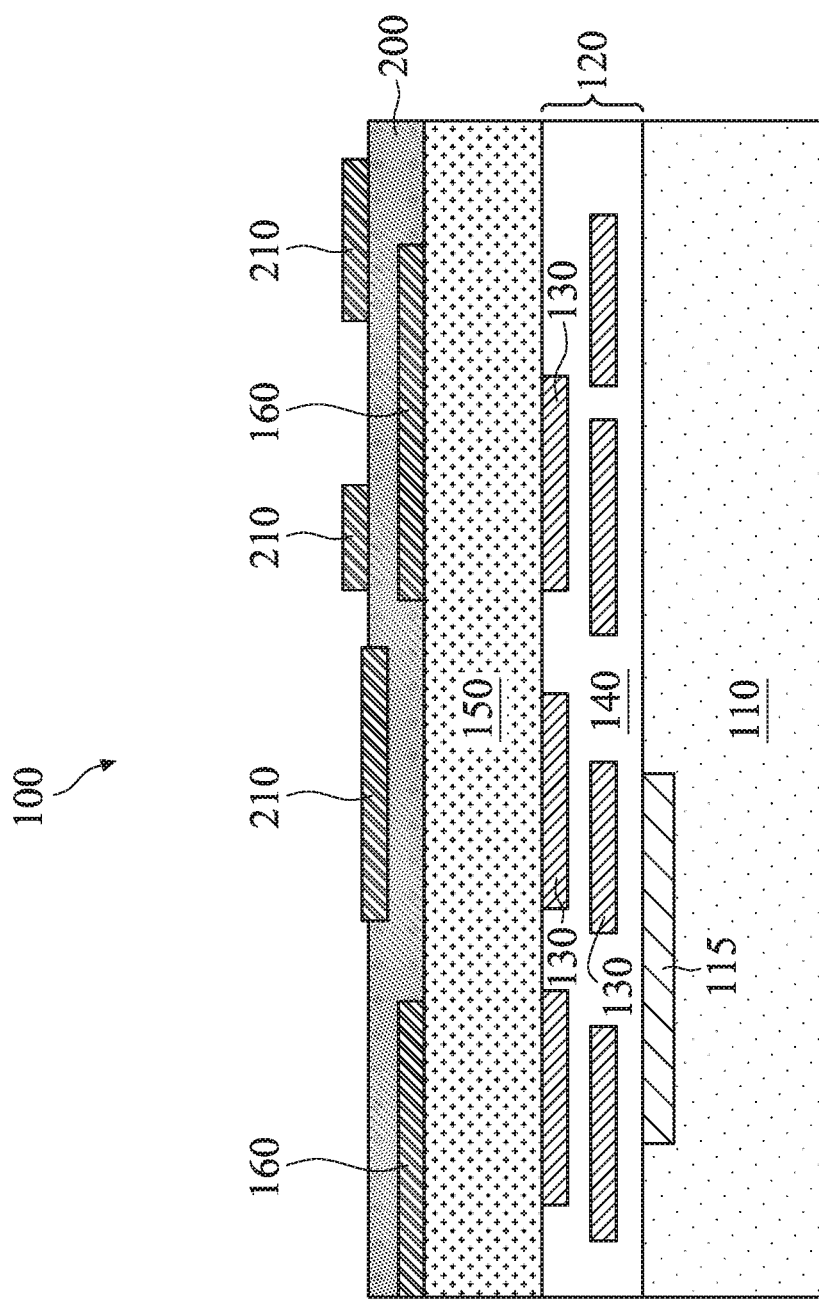

Referring now to FIG. 6, a conductive layer 210 is formed over the dielectric layer 200. In some embodiments, the conductive layer 210 includes a metal material, for example a metal material having a substantially similar material composition as the conductive layer 160. The conductive layer 210 may be formed by depositing a conductive layer using a suitable deposition process, and thereafter patterning the deposited conductive layer to form the various segments of the conductive layer 210. The various segments of the conductive layer 210 may also serve as the electrodes or conductive plates of the SHDMIM capacitor. The dielectric layer 200 provides electrical isolation or insulation between the conductive layer 160 and the segments of the conductive layer 210.

Figure 7:
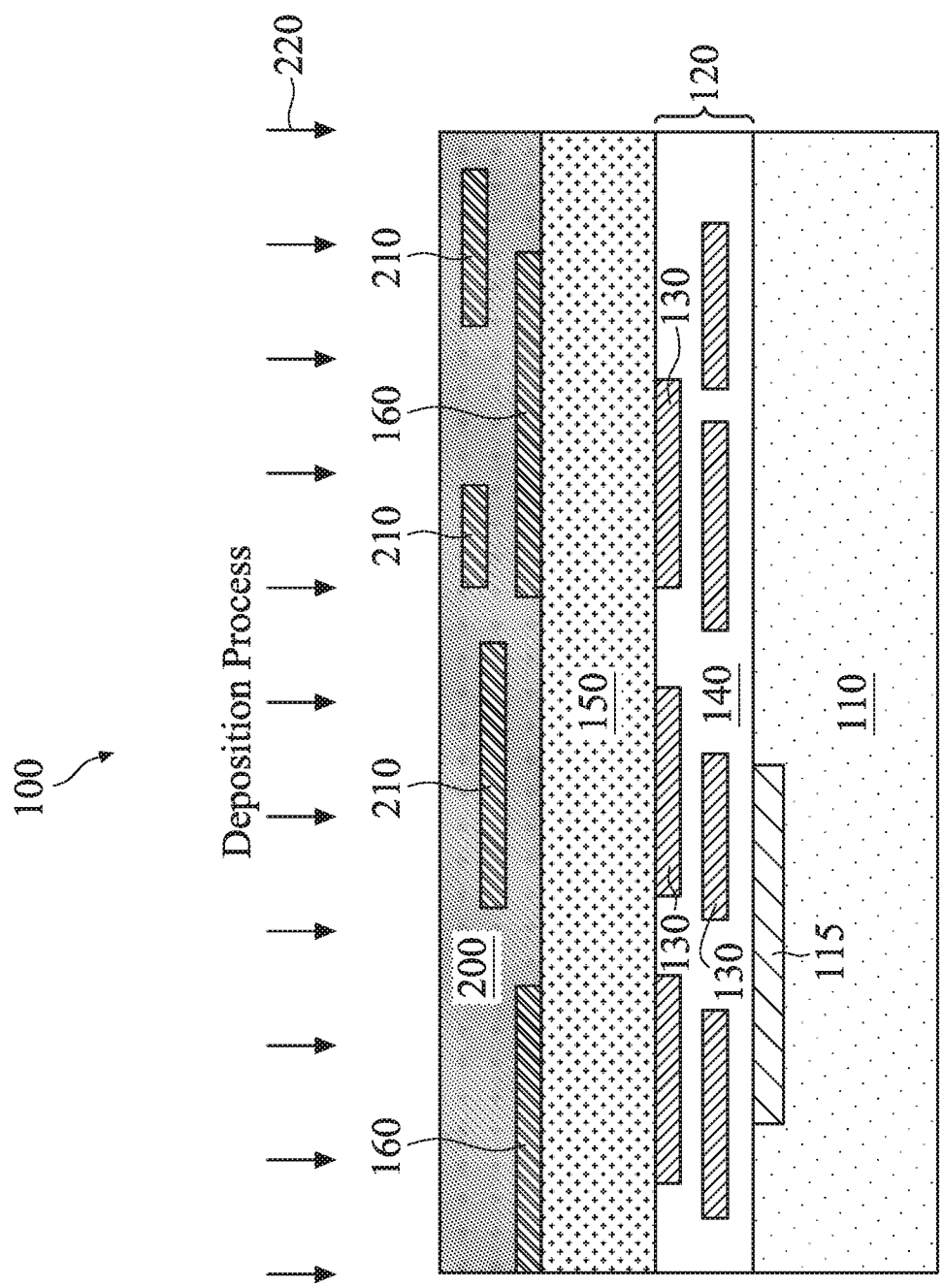

Referring now to FIG. 7, a deposition process 220 is performed to expand the dielectric layer 200 over the conductive layer 210. The deposition process 220 may include CVD, PVD, ALD, or combinations thereof. In some embodiments, the deposited material may include a high-k dielectric material.

Figure 8:
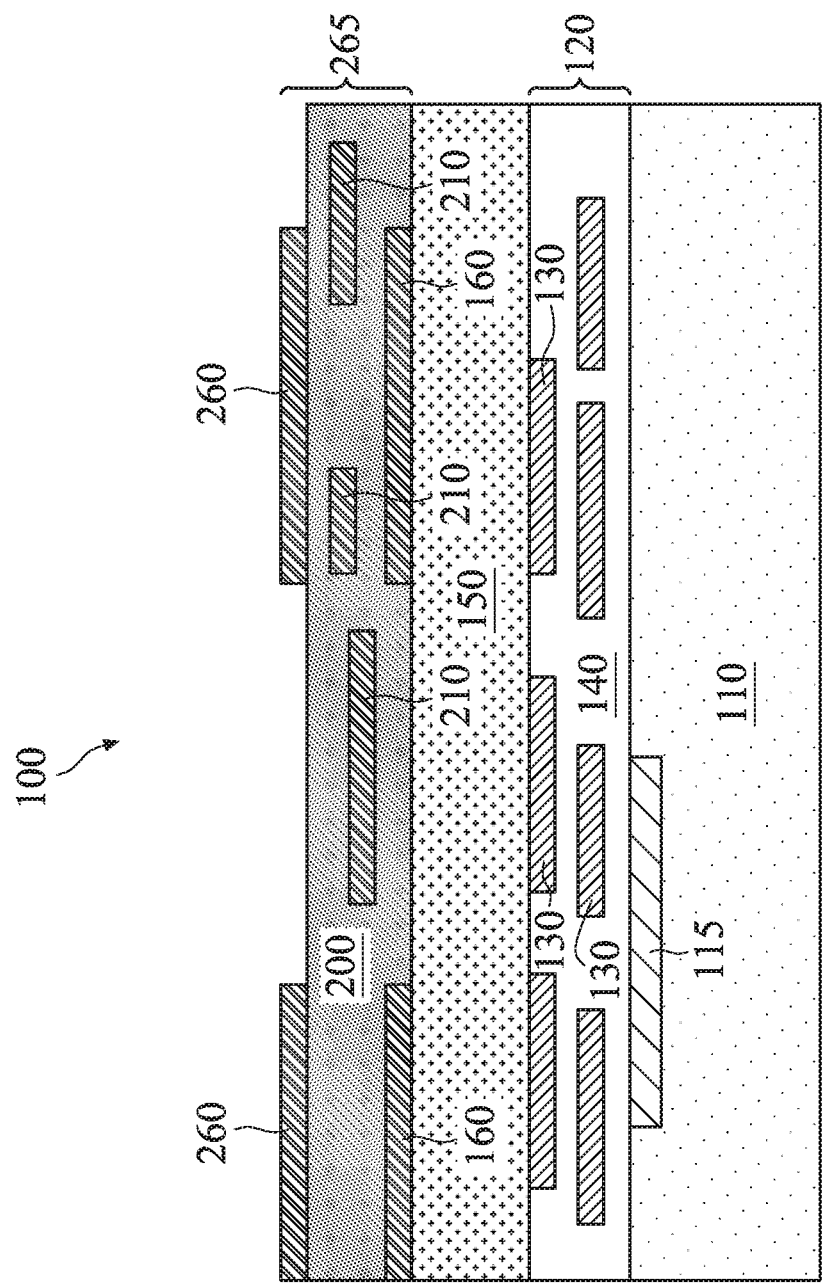

Referring now to FIG. 8, a conductive layer 260 is formed over the dielectric layer 200. In some embodiments, the conductive layer 260 includes a metal material, for example a metal material having a substantially similar material composition as the conductive layers 160 or 210 (e.g., titanium nitride). The conductive layer 260 may be formed by depositing a conductive layer using a suitable deposition process, and thereafter patterning the deposited conductive layer to form the various segments of the conductive layer 260. The various segments of the conductive layer 260 may also serve as the electrodes or conductive plates of a SHDMIM capacitor 265. The dielectric material 200 may serve as the dielectric material of the SHDMIM capacitor 265.

Note that the SHDMIM capacitor 265 is a multi-plate capacitor that may include more than just two conductive plates (or more than two metal layers). For example, the SHDMIM capacitor 265 as shown in FIG. 8 may include three conductive layers 160, 210, and 260 that are vertically stacked over one another. Since a capacitor includes two electrodes, some of these conductive plates may be electrically coupled together to serve as one electrode. For example, one segment of the conductive layer 210 may serve as one electrode of the SHDMIM capacitor 265, and a segment of the conductive layer 160 may be electrically coupled to a segment of the conductive layer 260 to collectively serve as another electrode of the SHDMIM capacitor 265. It is also understood that FIGS. 1-8 merely illustrate a non-limiting example of the fabrication process for a SHDMIM capacitor 265. The arrangement or configuration of the various conductive layers 160, 210, 260 of the SHDMIM capacitor 265 shown in FIG. 8 is not meant to be limiting. The SHDMIM capacitor 265 may have other shapes or configurations, or other number of conductive or metal layers (e.g., more than three) in other embodiments.

Figure 9:
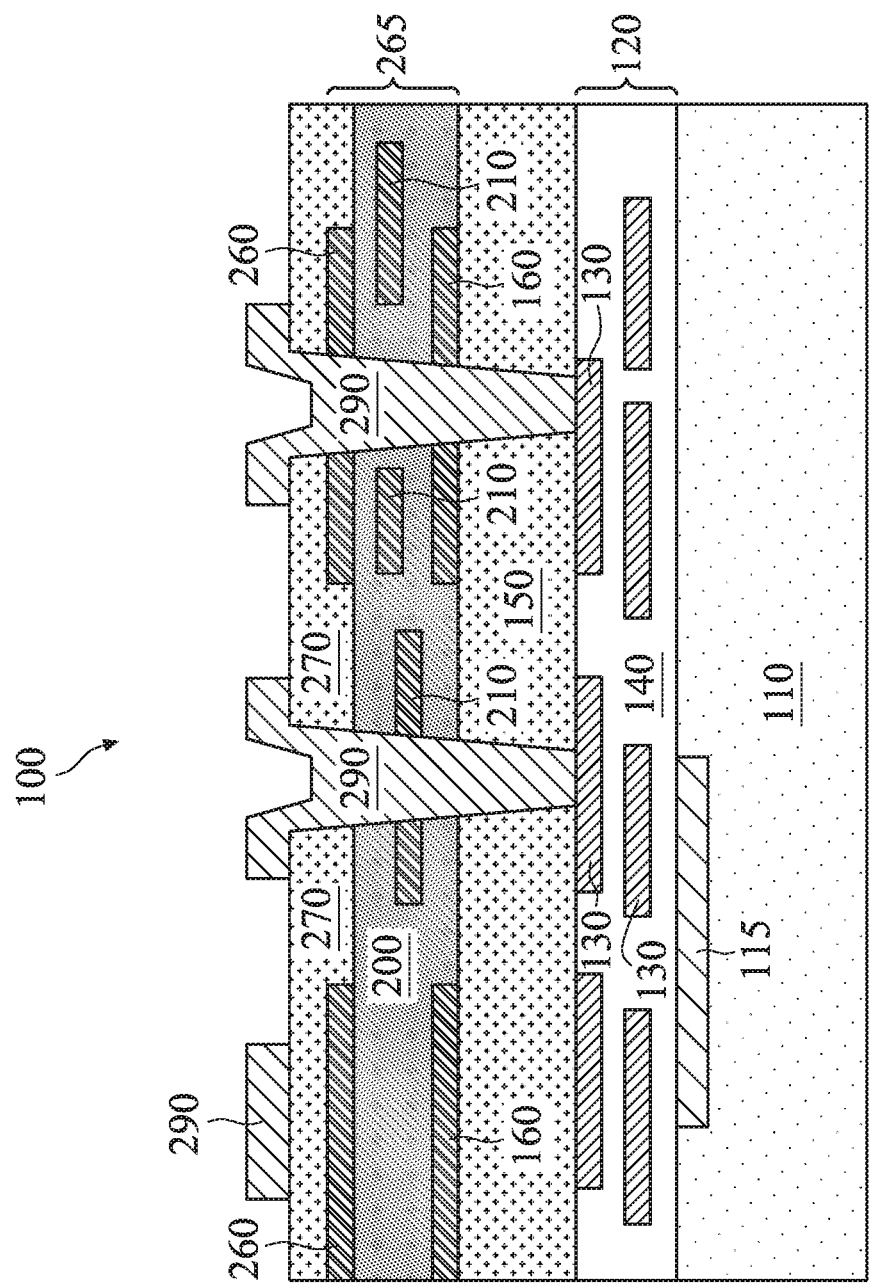

Referring now to FIG. 9, a passivation film 270 is formed over the conductive layer 260 and over the exposed surfaces of the dielectric layer 200. In some embodiments, the passivation film 270 may include a substantially similar material as the passivation film 150, for example it may include SiN or USG. The formation of the passivation film 270 embeds the SHDMIM capacitor 265 within the passivation films 150 and 270.

Thereafter, a plurality of conductive pads 290 may be formed. The conductive pads may be formed using one or more patterning, etching, and deposition processes. For example, openings or trenches may be etched to vertically extend through selected regions of the passivation films 150 and 270 and the dielectric layer 200, as well as the conductive layers 160, 210, and 260. The openings or trenches may then be filled with a conductive material (e.g., aluminum) to form the conductive pads 290. The conductive pads 290 provide electrical connectivity to the various electrodes or conductive plates of the SHDMIM capacitor 265, for example to a subset of the conductive layers 160, 210, and 260. In the illustrated embodiment, some of the conductive pads 290 are also electrically coupled to a subset of the metal lines 130 of the interconnection structure 120, thereby electrically interconnecting the electrodes or conductive plates of the SHDMIM capacitor 265 to the interconnection structure 120.

Figure 10:
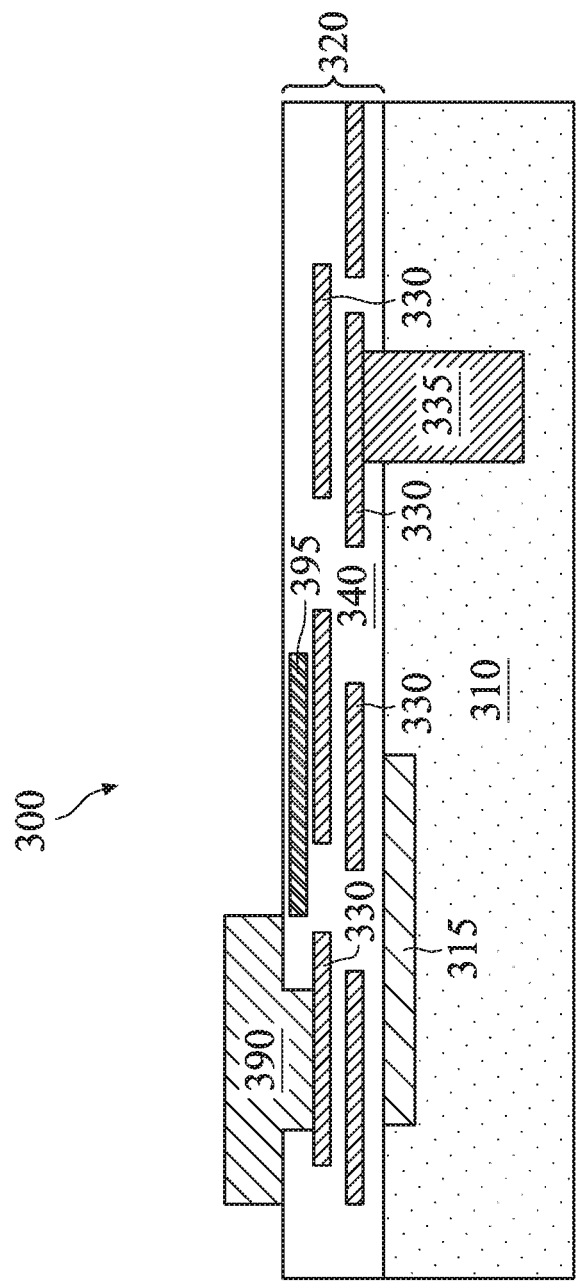

FIGS. 10-16 illustrate a series of diagrammatic fragmentary cross-sectional side view drawings that show how IC dies containing one or more SHDMIM capacitors (such as the SHDMIM capacitor 265) are bonded or packaged according to various aspects of the present disclosure in one embodiment. Referring now to FIG. 10, a die 300 is provided. The die 300 may be a portion of a wafer that has not been singulated yet. The die 300 may include a substrate 310. The substrate 310 may be similar to the substrate 110 discussed above with reference to FIGS. 1-9. The die 300 may include an electrical circuitry 315. The electrical circuitry 315 may be similar to the electrical circuitry 115 discussed above with reference to FIGS. 1-9.

The die 300 may also include an interconnection structure 320. The interconnection structure 320 may be similar to the interconnection structure 120 discussed above with reference to FIGS. 1-9. For example, the interconnection structure 320 may include a plurality of metal layers in which meta lines—such as metal lines 330—are formed. The metal lines 330 are electrically isolated from one another by a dielectric material 340, which may be similar to the dielectric material 140 discussed above with reference to FIGS. 1-9.

Vias or contacts may also be formed to be electrically coupled to one or more of the metal lines 330. As one example, a through substrate via (TSV) 335 (also referred to as a through silicon via) may be formed to extend at least partially through the substrate 310 vertically. One end of the TSV 335 is formed to be in physical contact with one of the metal lines 330. As such, the TSV 335 may be used to provide electrical connectivity to the interconnection structure 320, and in turn, provide electrical connectivity to the rest of the devices or components of the die 300, such as the electrical circuitry 315. As another example, a conductive pad 390 may be formed to be in electrical and physical contact with another one of the metal lines 330. The conductive pad 390 may be similar to the conductive pad 290 discussed above with reference to FIG. 9. The conductive pad 390 may also be used to provide electrical connectivity to the interconnection structure 320, and in turn, provide electrical connectivity to the rest of the devices or components of the die 300, such as the electrical circuitry 315

The die 300 also includes a SHDMIM capacitor 395 embedded therein. The SHDMIM capacitor 395 may be fabricated using the process flow discussed above with reference to FIGS. 1-9, for example. The SHDMIM capacitor 395 may include a plurality of metal plates (e.g., metal plates that correspond to the segments of the conductive layers 160, 210, and 260 of FIG. 9), but for reasons of simplicity, these metal plates are not separately illustrated in FIG. 10. The SHDMIM capacitor 395 may be embedded in a passivation film similar to the passivation film 150 or 270 discussed above with reference to FIGS. 5-9, where the passivation film may be formed over the interconnection structure 320. For reasons of simplicity, the passivation film in which the SHDMIM capacitor 395 is embedded is not specifically shown herein. Alternatively, the SHDMIM capacitor 395 may be embedded in the dielectric layer 340 of the interconnection structure 320.

Figure 11:
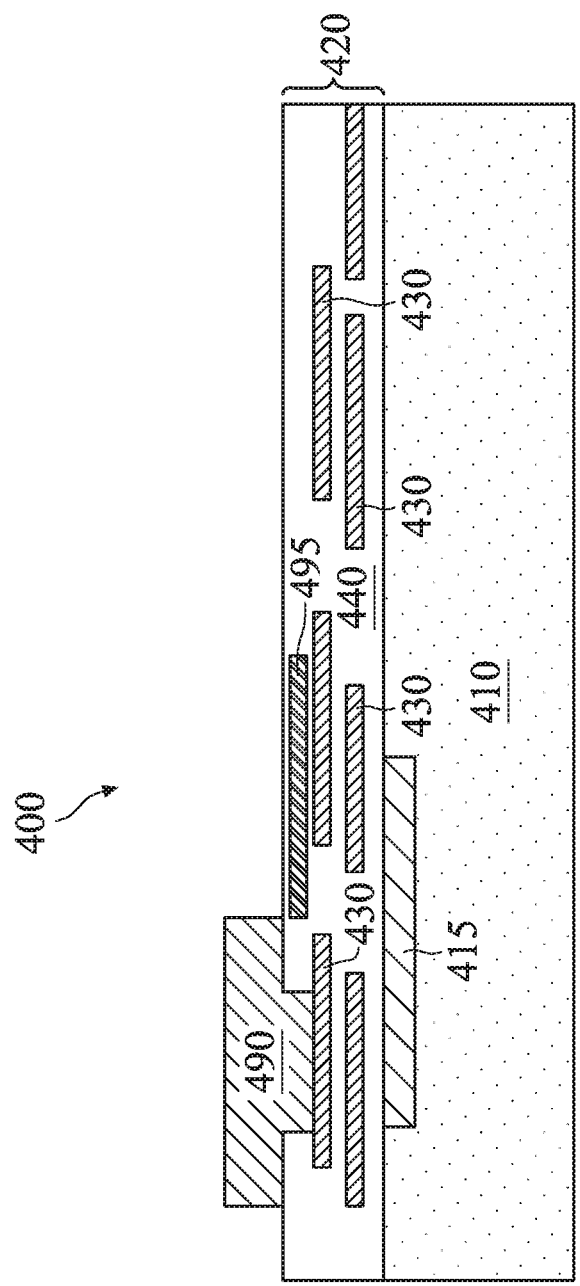

Referring now to FIG. 11, a die 400 is also provided. The die 400 may be substantially similar to the die 300 in many respects. For example, the die 400 may also be a part of an unsingulated wafer and may include a substrate 410 that is similar to the substrate 310 of the die 300, electrical circuitry 415 that is similar to the electrical circuitry 315 of the die 300, an interconnection structure 420 (e.g., containing metal lines 430 and a dielectric layer 440) that is similar to the interconnection structure 320 of the die 300, a conductive pad 490 that is similar to the conductive pad 390 of the die 300, and an embedded SHDMIM capacitor 495 that is similar to the embedded SHDMIM capacitor 395 of the die 300. It is also understood that the passivation film in which the SHDMIM capacitor 495 is embedded is not specifically shown herein for reasons of simplicity. Unlike the die 300, however, the die 400 may not include a TSV (e.g., the TSV 335 of the die 300).

Figure 12:
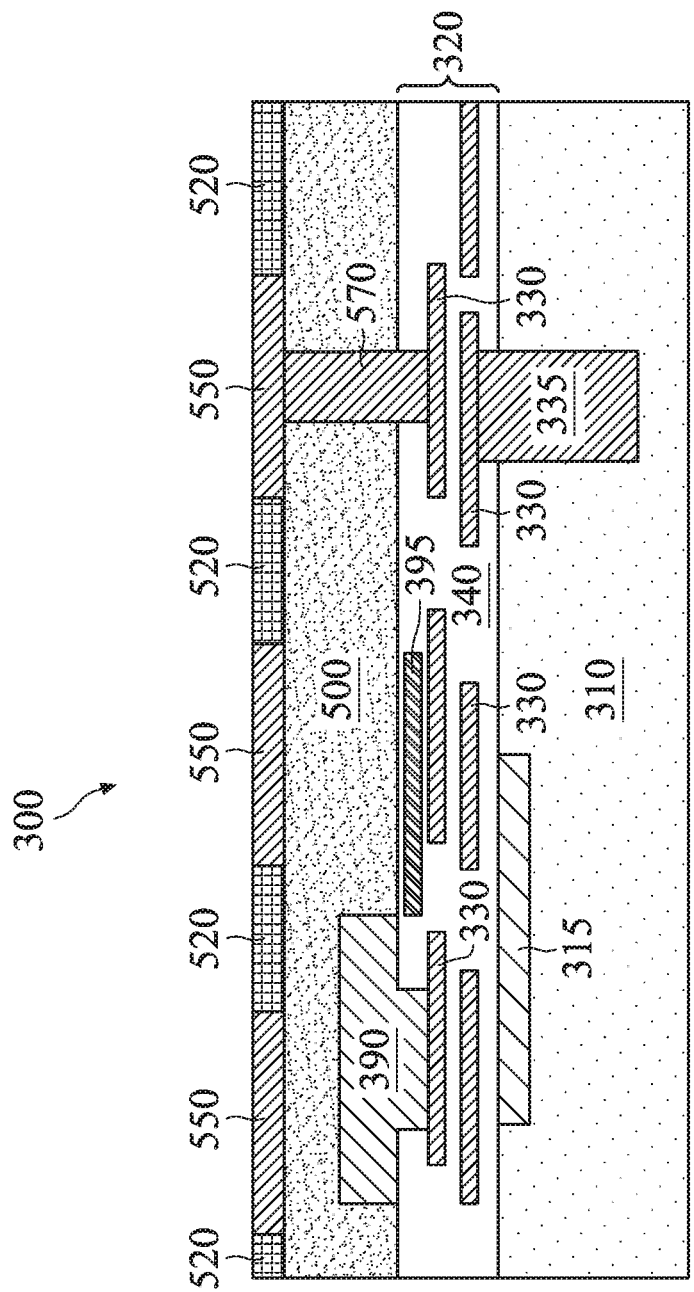
Figure 13:
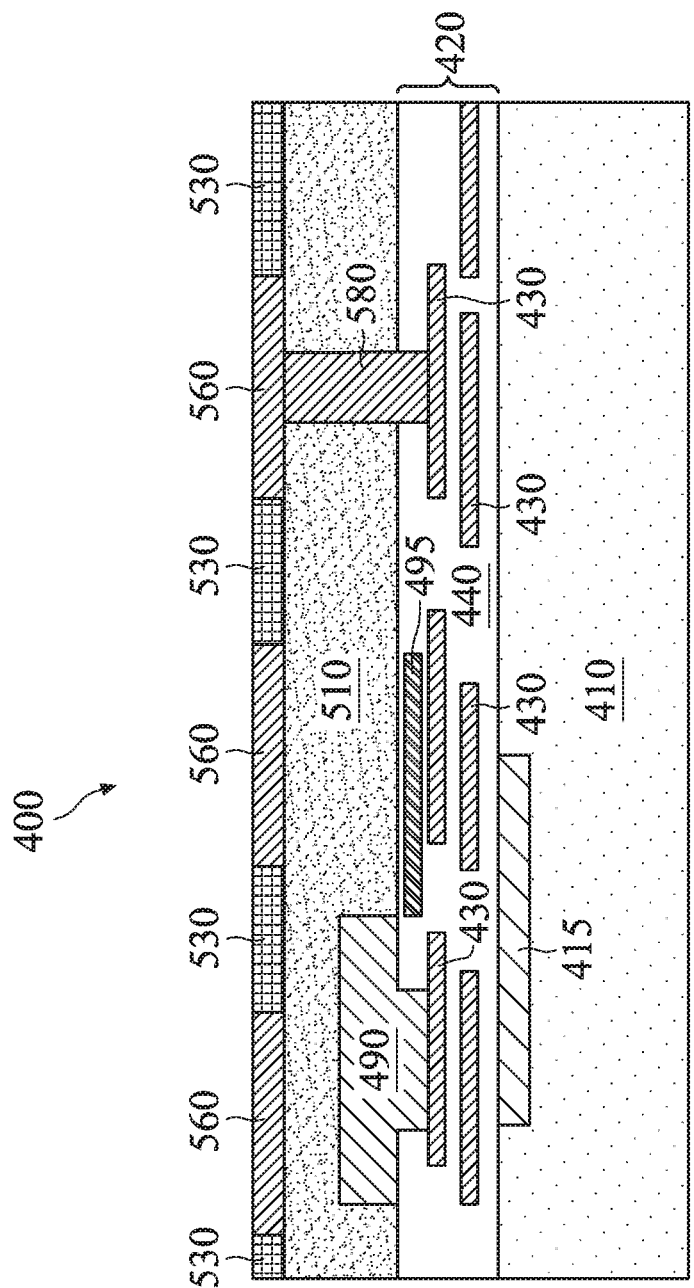

Referring now to FIGS. 12 and 13, dielectric layers 500 and 510 are formed over the interconnection structures 320 and 420 of the dies 300 and 400, respectively. In some embodiments, the dielectric layers 500 and 510 may each include a silicon oxide material. The upper surfaces of the dielectric layers 500 and 510 may each undergo a planarization process, for example a chemical mechanical polishing (CMP) process. Thereafter, dielectric layers 520 and 530 may be formed over the dielectric layers 500 and 510, respectively. In some embodiments, the dielectric layers 520 and 530 may include silicon oxide, silicon nitride, silicon carbide, silicon oxynitride, or combinations thereof. Bonding pads may then be formed in the dielectric layers 520 and 530. For example, a plurality of bonding pads 550 may be formed in the dielectric layer 520, while a plurality of bonding pads 560 may be formed in the dielectric layer 530. The bonding pads 550 and 560 may be formed by etching a plurality of trenches in the dielectric layers 520 and 530, respectively, and subsequently filling the trenches with a conductive material, such as copper, aluminum, titanium, cobalt, or combinations thereof.

A TSV 570 is also formed in the die 300, and a TSV 580 is also formed in the die 400. The TSV 570 extends vertically through the dielectric layer 500 and is electrically and physically coupled to one of the metal lines 330 and one of the bonding pads 550. The TSV 580 extends vertically through the dielectric layer 510 and is electrically and physically coupled to one of the metal lines 430 and one of the bonding pads 560.

Figure 14:
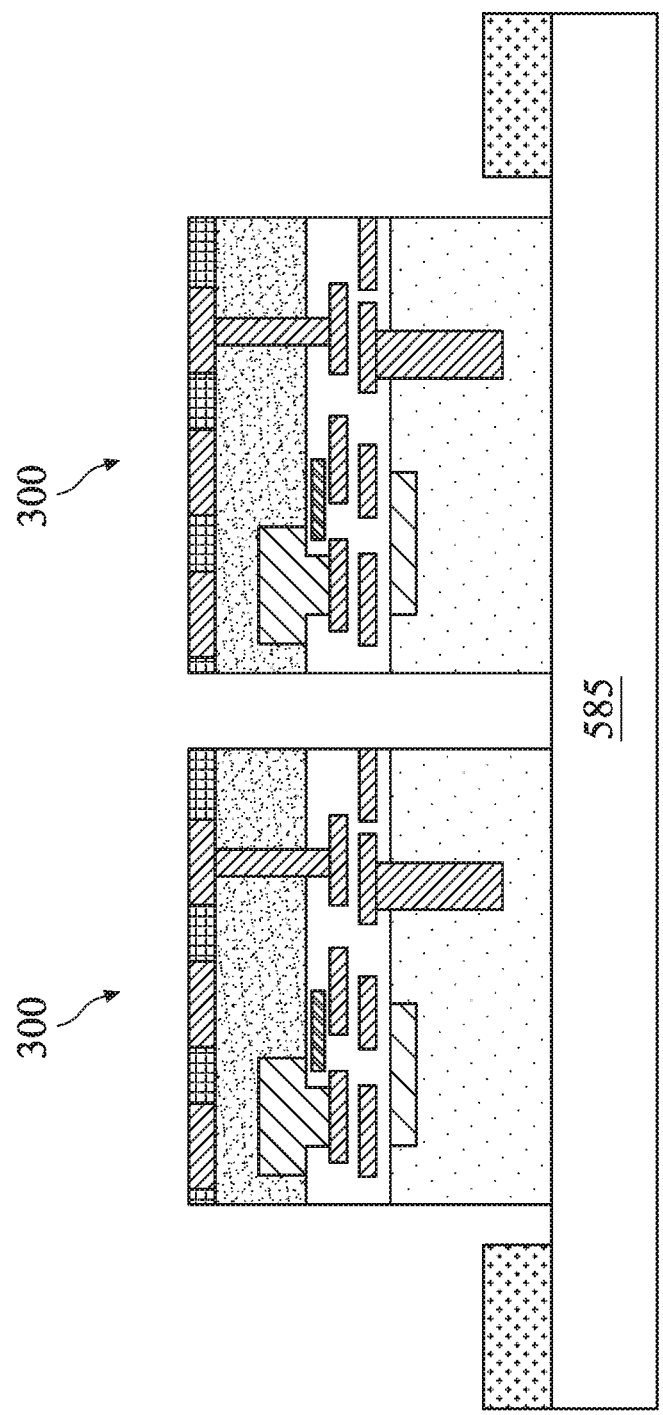

Referring now to FIG. 14, the wafer containing the die 300 is attached to a film frame 585, for example through an adhesive material. The wafer then undergoes a singulation process (e.g., sawing or dicing) to separate the dies 300 from one another. In other words, the singulation process turns the unsingulated wafer into a plurality of individual dies 300. Similarly, the wafer containing the die 400 may also be singulated to form a plurality of individual dies 400.

Figure 15:
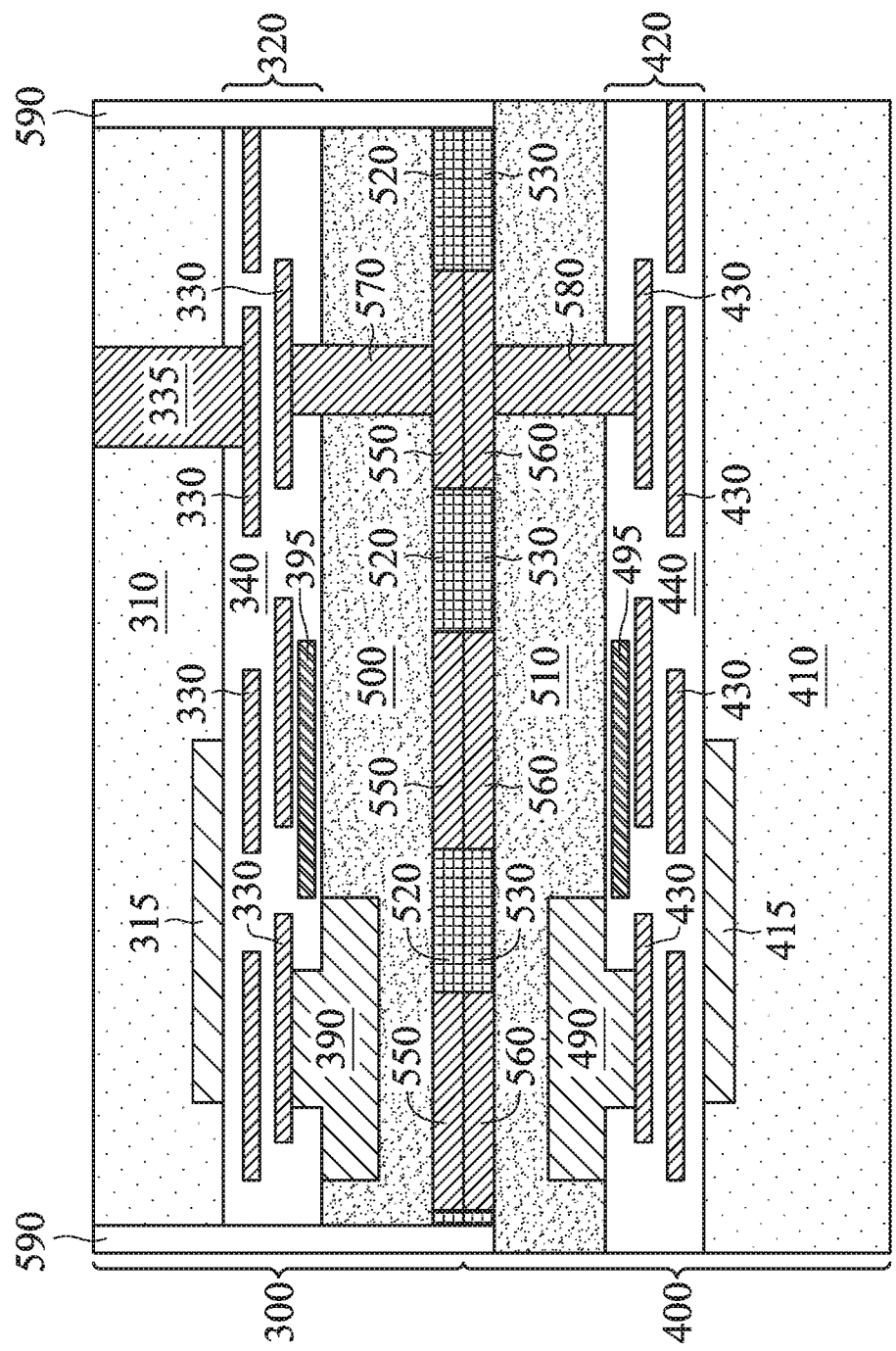

Referring now to FIG. 15, the die 300 and the die 400 are bonded together. For example, the die 300 may be vertically flipped and then bonded to the die 400, such that the bonding pads 550 of the die 300 are bonded to the bonding pads 560 of the die 400. A gap-fill material 590 may also be formed on the side surfaces of the die 300 when the lateral dimensions of the dies 300 and 400 are not identical. In other words, the gap-filling material 590 may fill empty gaps or spaces as a result of the size difference between the dies 300 and 400. A polishing or etching process may also be performed to the die 300 to partially remove the substrate 310 until the TSV 335 is exposed. Another planarization process may also be optionally performed to flatten the exposed surfaces of the substrate 310 and the TSV 335.

Figure 16:
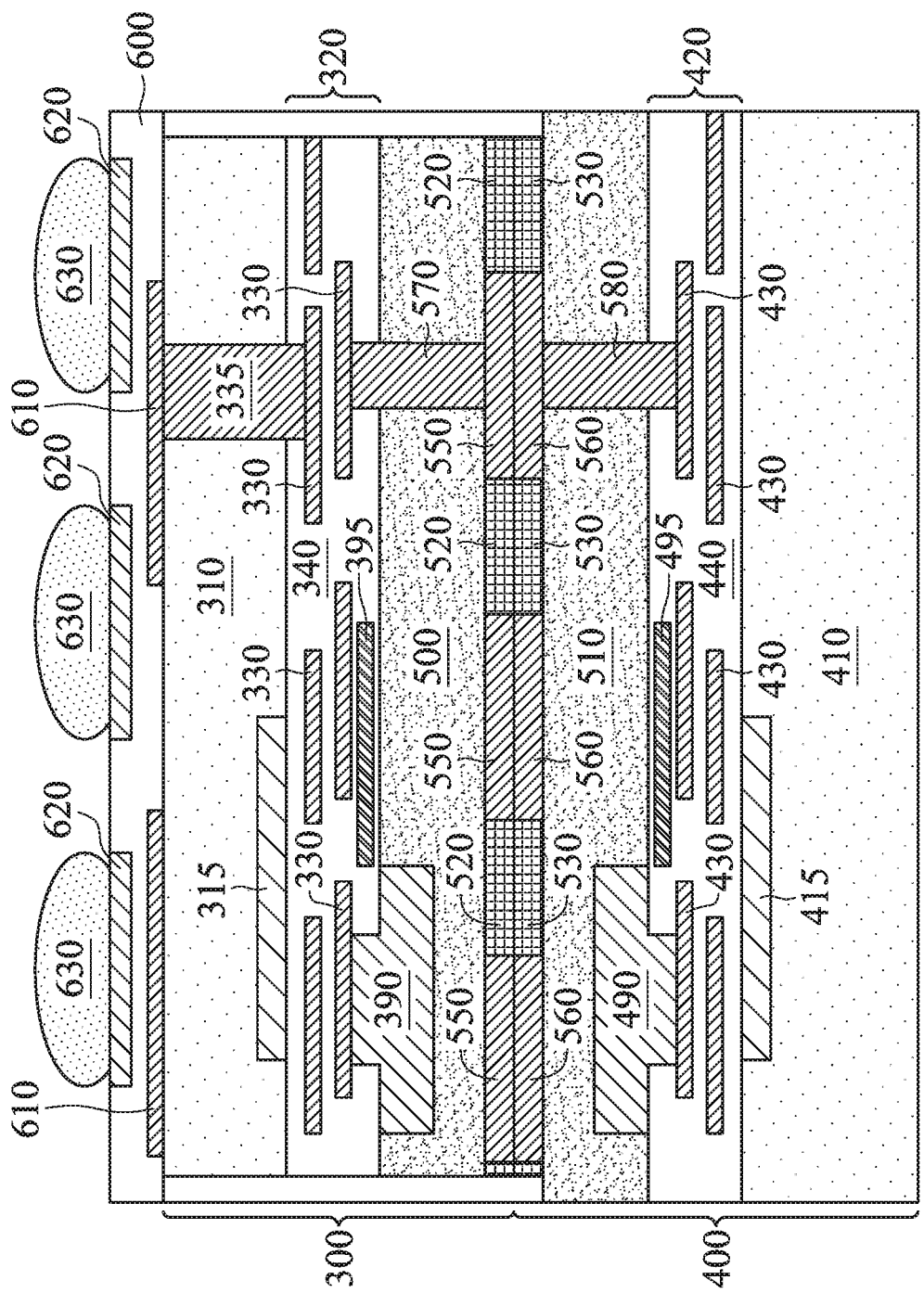

Referring now to FIG. 16, a dielectric layer 600 may be formed over the substrate 310 and over the TSV 335. In some embodiments, the dielectric layer 600 may include a passivation layer, for example it may include a material that is substantially similar to the passivation film 150 or the passivation film 270 discussed above. One or more metal lines, such as metal lines 610, may be formed in the dielectric layer 600. One of these metal lines 610 may also be formed to be in electrical connectivity with the TSV 335. A plurality of bonding pads 620 may also be formed in the dielectric layer 600. Thereafter, a plurality of conductive bumps 630 (or solder bumps) may be formed on the bonding pads 620. In some embodiments, the conductive bumps 630 may each include a metal material, so that they may allow electrical access to the various components (e.g., the electrical circuitry 315 or 415 or the SHDMIM capacitors 395 or 495) of the dies 300 and 400.

Figure 17:
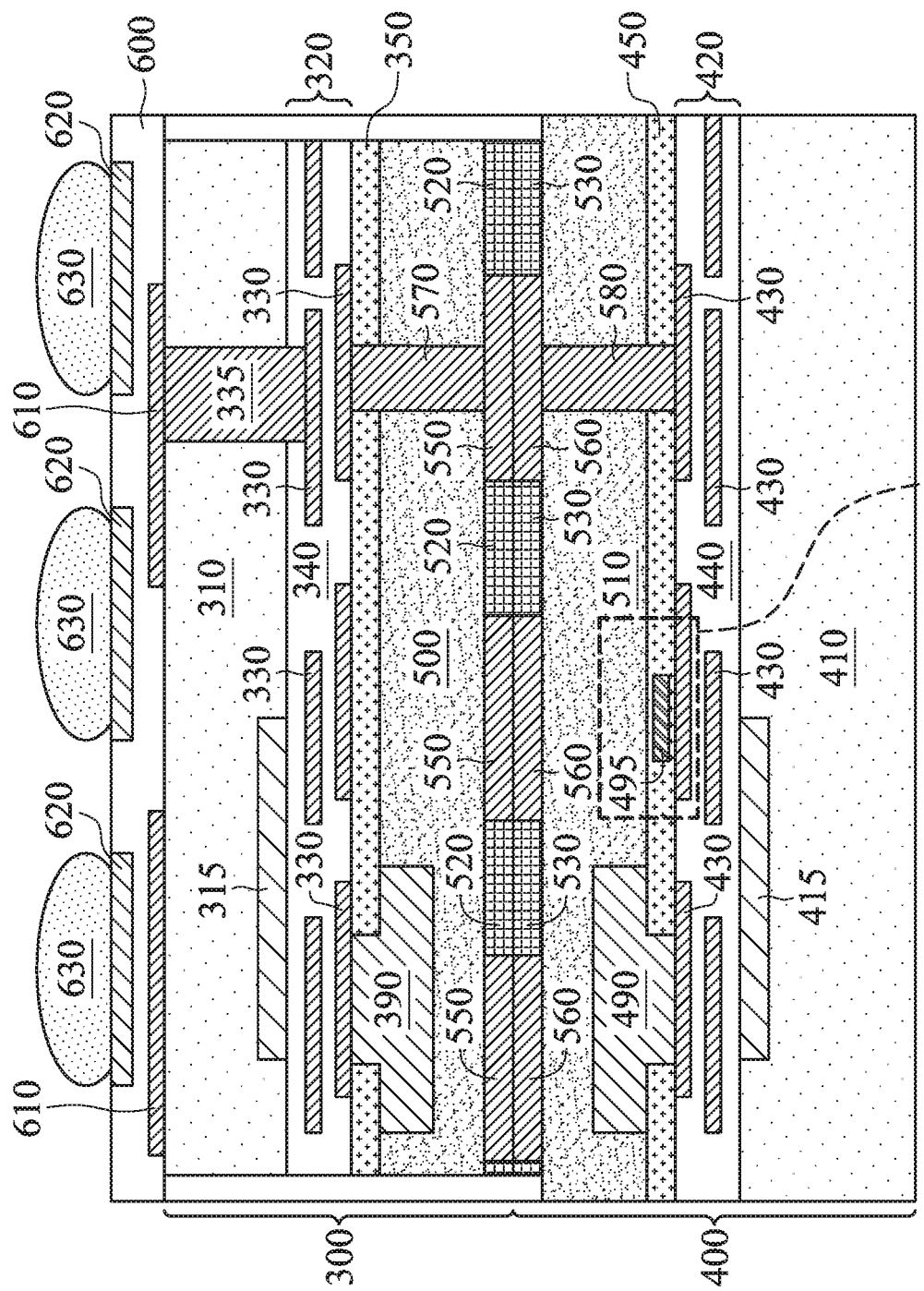

FIG. 17 illustrates another embodiment of a packaging scheme involving a SHDMIM. For reasons of clarity and consistency, similar components appearing in FIGS. 16 and 17 will be labeled the same. As shown in FIG. 17, the die 300 includes a passivation film 350 that is disposed between the dielectric layer 500 and the interconnection structure 320, and the die 400 includes a passivation film 450 that is disposed between the dielectric layer 510 and the interconnection structure 420. The passivation films 350 and 450 may be similar to the passivation films 150 or 270 discussed above with reference to FIGS. 2-9.

Figure 18:
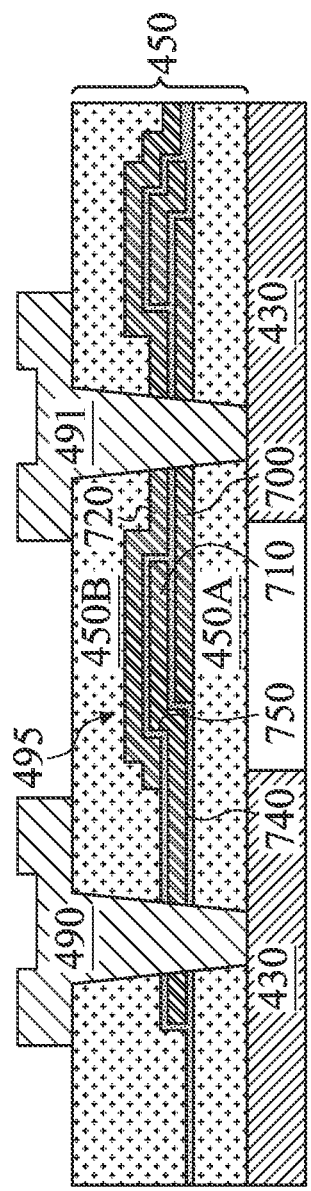

The SHDMIM capacitor 495 is embedded in the passivation film 450. To facilitate an understanding of the structure of the SHDMIM capacitor 495, a magnified cross-sectional view of a portion 650 of the die 400 containing the SHDMIM capacitor 495 is shown in FIG. 18. The SHDMIM capacitor 495 is embedded in the passivation film 450, which may include a plurality of layers, for example a passivation film layer 450A and a passivation film layer 450B disposed over the passivation film layer 450A. The SHDMIM capacitor 495 may also include a plurality of conductive layers (e.g., metal plates) that are vertically stacked over one another. For example, the SHDMIM capacitor 495 may include a conductive layer 700, a conductive layer 710 formed over the conductive layer 700, and a conductive layer 720 formed over the conductive layer 710. The conductive layers 700, 710, and 720 may be formed similar to the conductive layers 160, 210, and 260 discussed above with reference to FIGS. 4-9. The conductive layers 700, 710, and 720 are also electrically separated or isolated from one another by dielectric layers 740 and 750. For example, the dielectric layer 740 separates the conductive layers 700 and 710 from each other, and the dielectric layer 750 separates the conductive layers 710 and 720 from each other. The dielectric layers 740 and 750 may be formed similar to the dielectric layer 200 discussed above with reference to FIGS. 4-9. For example, the dielectric layers 740 and 750 may each contain a high-k dielectric material.

Note that in the embodiment shown in FIG. 18, the conductive layer 710 is formed partially over the conductive layer 700. For example, one segment of the conductive layer 710 is formed over a "left" portion of the conductive layer 700, while another segment of the conductive layer 710 is formed over a "right" portion of the conductive layer 700. These two segments of the conductive layer 710 are electrically insulated from each other as well, for example by the dielectric layer 740 and 750. Also, a portion of the conductive layer 720 may be formed in between the two segments of the conductive layer 710.

As shown in FIG. 18, the conductive layers 700 and 720 of the SHDMIM capacitor 495 are each electrically connected to a conductive pad 491 (e.g., through their side surfaces), which extends vertically through the passivation film 450. As such, the conductive pad 491 may be used to provide an electrical connection to one electrode of the SHDMIM capacitor 495—the electrode comprised of the conductive layers 700 and 720 as its metal plates. Meanwhile, the "left" segment of the conductive layer 710 of the SHDMIM capacitor 495 is electrically connected to a conductive pad 490 (e.g., through their side surfaces), which also extends vertically through the passivation film 450. As such, the conductive pad 490 may be used to provide an electrical connection to the other electrode of the SHDMIM capacitor 495—the electrode comprised of the conductive layer 710 as its metal plate. In this manner, the SHDMIM capacitor 495 may comprise a plurality of metal layers or plates (e.g., more than two), where a first subset of the metal layers (e.g., the conductive layers 700 and 720) are used to form one electrode, while a second subset of the metal layers (e.g., the conductive layer 710) is used to form another electrode. In some embodiments, the first subset and the second subset of the metal layers are mutually exclusive from each other, as is the case for the embodiment of FIG. 18. It is also understood that other SHDMIM capacitors similar to the SHDMIM capacitor 495 may be formed embedded in the passivation film 450. For example, one or more additional SHDMIM capacitor 495 may be formed to the "left" or to the "right" of the SHDMIM capacitors 495, and these SHDMIM capacitors are still embedded in the passivation film 450 and are electrically connected to conductive pads that are similar to the conductive pads 490-491. For reasons of simplicity, however, these additional SHDMIM capacitors are not specifically illustrated herein.

Figure 19:
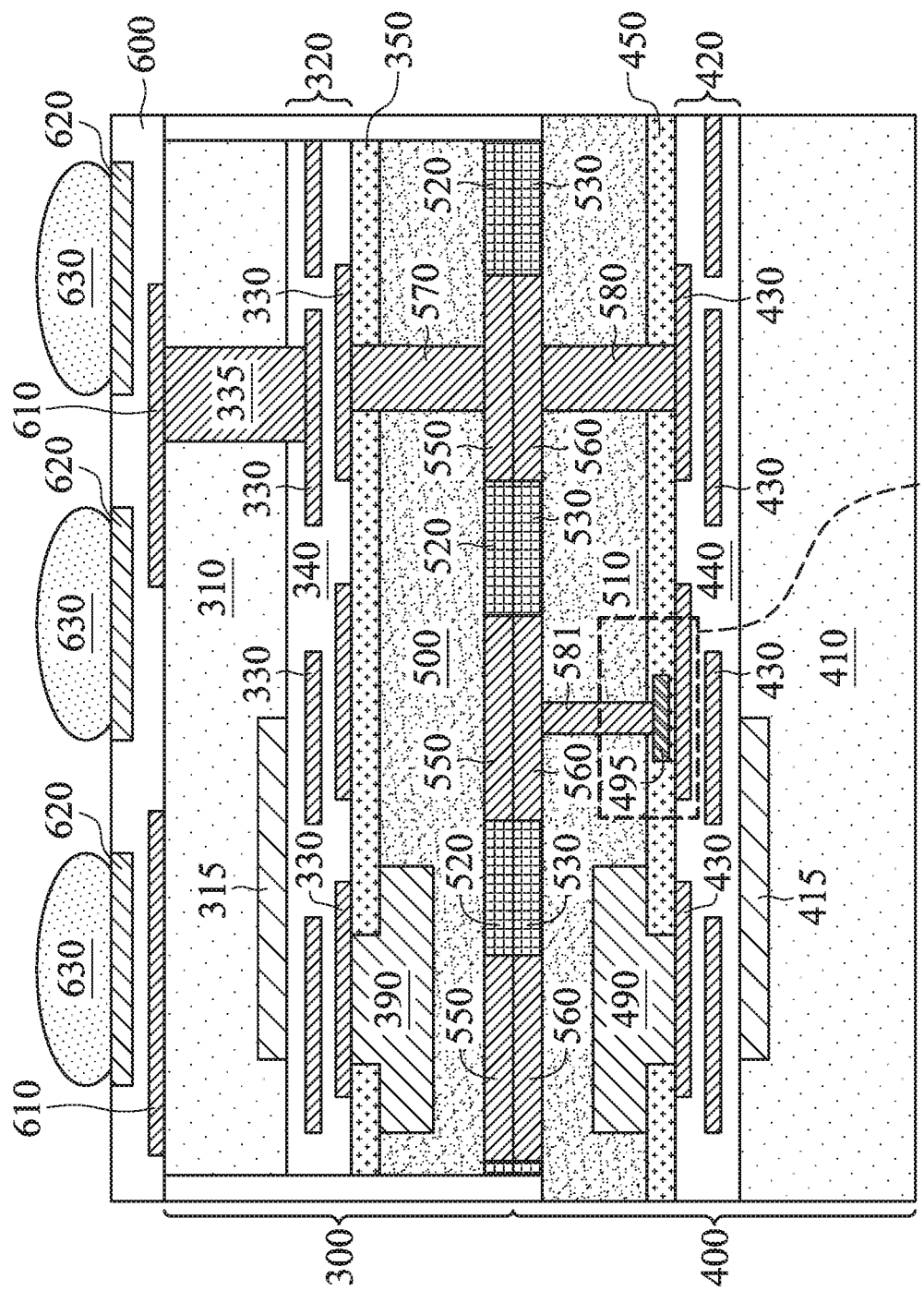
Figure 20:
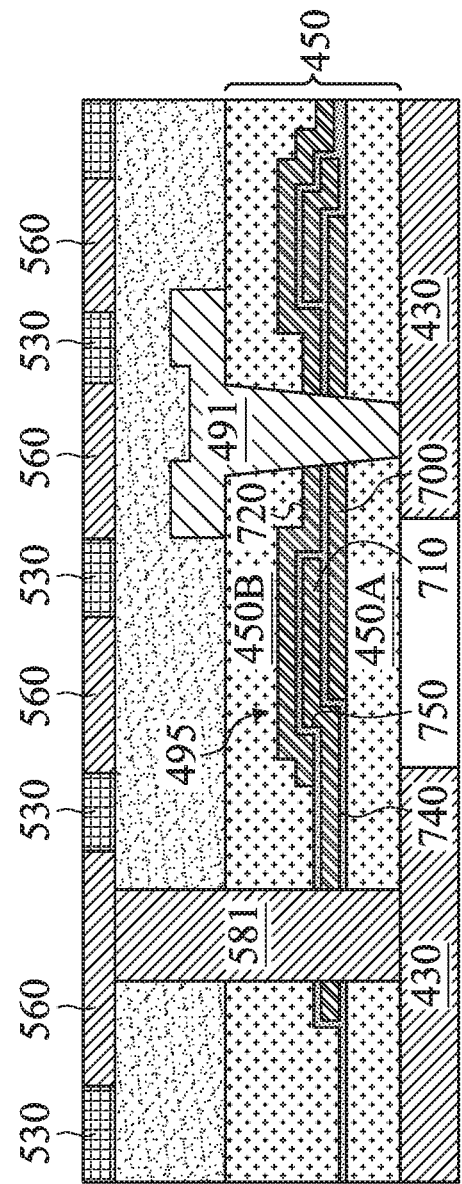

FIGS. 19-20 illustrate another embodiment of a packaging scheme involving a SHDMIM. Again, for reasons of clarity and consistency, similar components appearing in FIGS. 17-18 will be labeled the same in FIGS. 19-20. Referring now to FIG. 19, the SHDMIM capacitor 495 is electrically coupled to one of the bonding pads 560 through another TSV 581. Again, a magnified cross-sectional view of a portion 650 of the die 400 containing the SHDMIM capacitor 495 is shown in FIG. 20. The SHDMIM capacitor 495 includes the conductive layers 700, 710, and 720 as its metal plates. The SHDMIM capacitor 495 also includes the dielectric layers 740 and 750 as its dielectric material. As one electrode of the SHDMIM capacitor 495, the conductive layers 700 and 720 are electrically connected to the conductive pad 491. As the other electrode of the SHDMIM capacitor 495, the conductive layer 710 is electrically connected to the TSV 581. Since the TSV 581 is electrically connected to the bonding pad 560, the bonding pad 560 may also be used to gain electrical access to the SHDMIM capacitor 495. In other words, the conductive pad 491 and the TSV 581 may each serve as a control terminal of the SHDMIM capacitor 495. Again, it is understood that other SHDMIM capacitors (which may include TSVs similar to the TSV 581) similar to the SHDMIM capacitor 495 may be formed embedded in the passivation film 450. For example, one or more additional SHDMIM capacitor 495 may be formed to the "left" or to the "right" of the SHDMIM capacitors 495, and these SHDMIM capacitors are still embedded in the passivation film 450 and are electrically connected to conductive structures that are similar to the conductive pad 491 and the TSV 581. For reasons of simplicity, however, these additional SHDMIM capacitors are not specifically illustrated herein.

Compared to the embodiment shown in FIGS. 17-18, the embodiment shown in FIGS. 19-20 offers a reduction in control terminal area. This is because the TSV 581—as a control terminal for the SHDMIM capacitor 495—may be significantly smaller than the conductive pad 490 that was used as a control terminal for the SHDMIM capacitor 495 in the embodiment shown in FIG. 18. The reduction in control terminal area may increase chip estate efficiency and/or help reduce the size of the overall packaging structure, which may be desirable.

Figure 21:
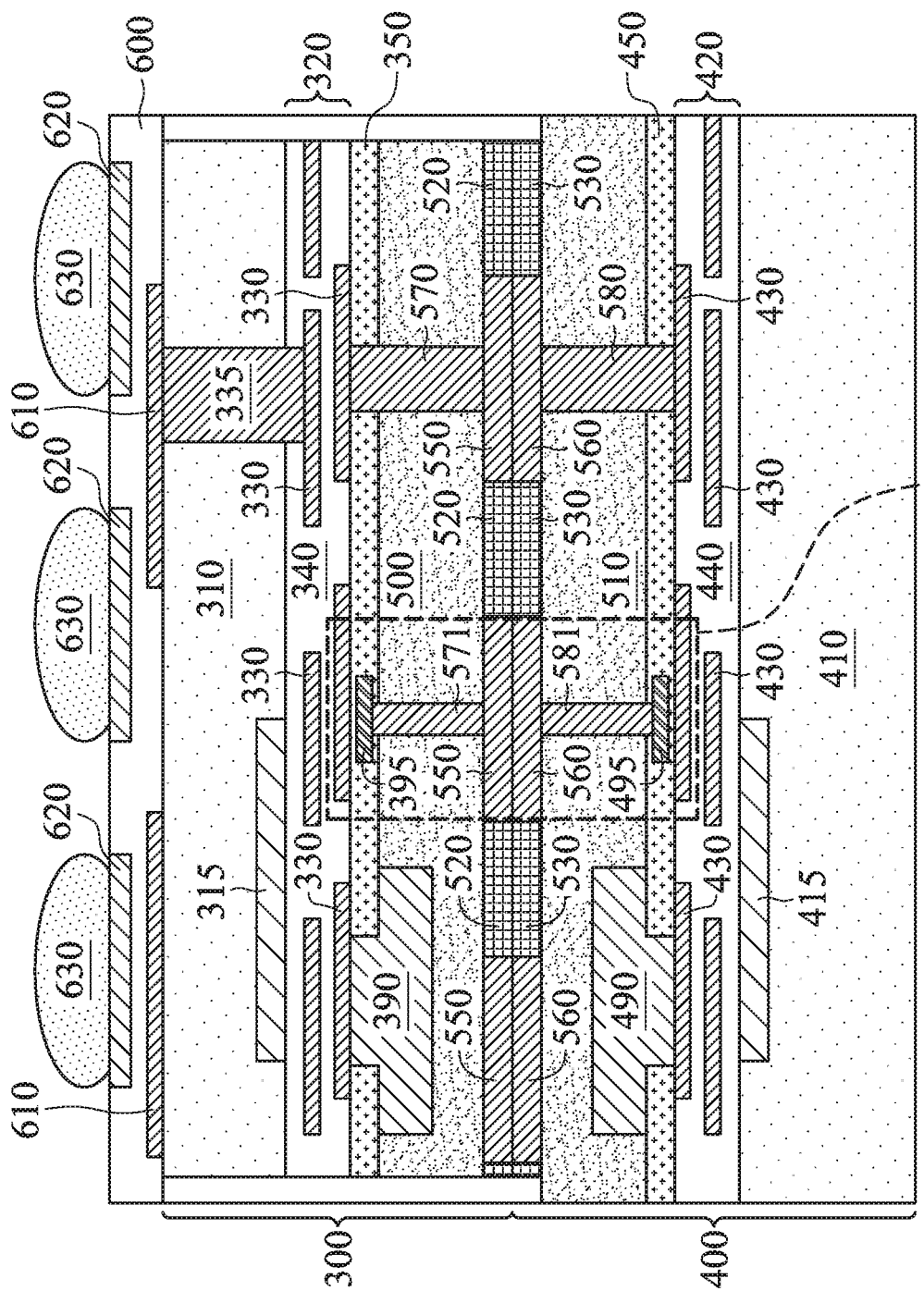
Figure 22:
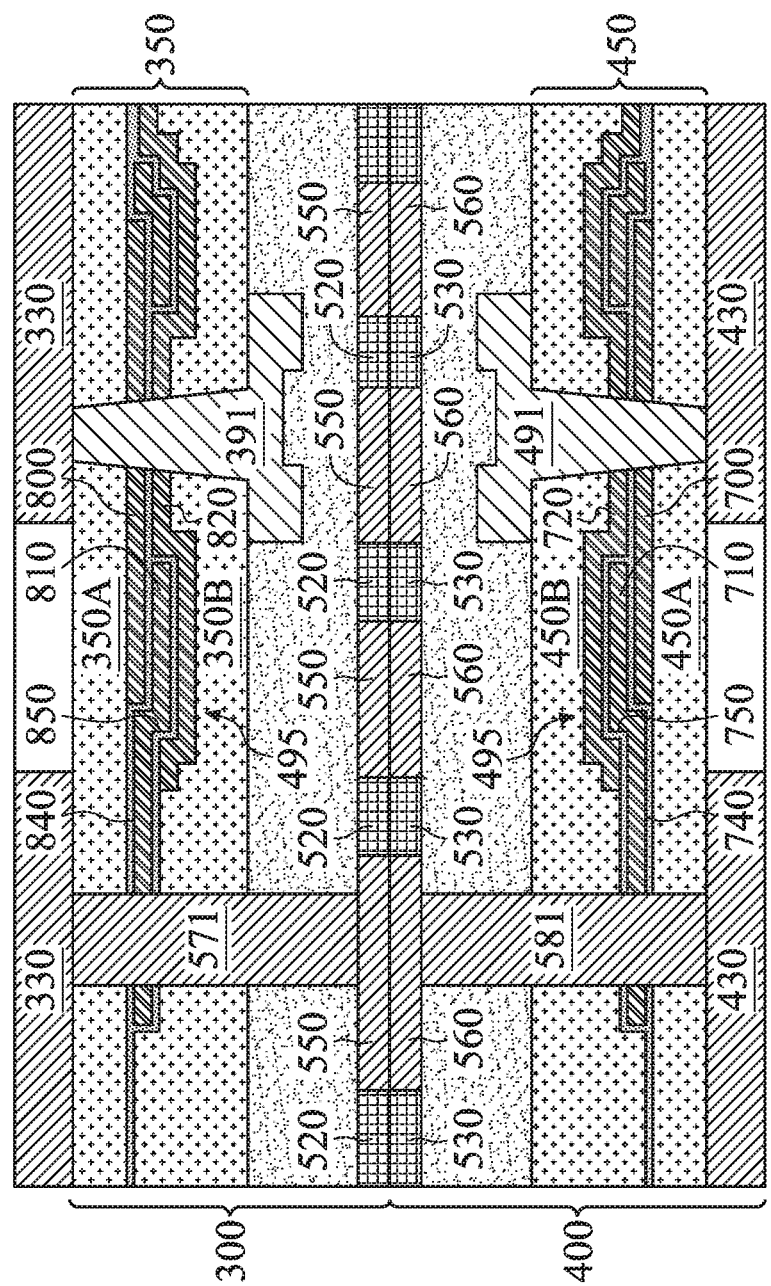

FIGS. 21-22 illustrate yet another embodiment of a packaging scheme involving a SHDMIM. Again, for reasons of clarity and consistency, similar components appearing in FIGS. 17-20 will be labeled the same in FIGS. 21-22. Referring now to FIG. 21, the die 300 includes the SHD- MIM capacitor 395, and the die 400 includes the SHDMIM capacitor 495. The SHDMIM capacitor 395 is embedded within the passivation film 350 and is coupled to one of the bonding pads 550 through a TSV 571, while the SHDMIM capacitor 495 is embedded within the passivation film 450 and is coupled to one of the bonding pads 560 through the TSV 581. Since the bonding pads 550 and 560 are bonded together, the SHDMIM capacitor 395 and 495 are electrically coupled together in parallel.

The parallel connection between the SHDMIM capacitor 395 and the SHDMIM capacitor 495 is illustrated in more detail in FIG. 22, which is a magnified view of a portion 650 of the dies 300 and 400. The arrangement of the SHDMIM capacitor 495 in the die 400 may be substantially similar to the embodiment shown in FIG. 20. The arrange of the SHDMIM capacitor 395 in the die 300 may substantially mirror that of the SHDMIM capacitor 495 in the die 400. For example, the SHDMIM capacitor 395 is embedded in the passivation film 350, which may include a plurality of layers, for example a passivation film layer 350A and a passivation film layer 350B. The SHDMIM capacitor 395 may also include more than two conductive layers (e.g., metal plates), for example conductive layers 800, 810, and 820 that are similar to the conductive layers 710, 720, and 730, respectively. The conductive layers 800-820 are also electrically separated or isolated from one another by dielectric layers 840 and 850 that are similar to the dielectric layers 740 and 750, respectively.

As one electrode of the SHDMIM capacitor 395, the conductive layers 800 and 820 are electrically connected to the conductive pad 391. As the other electrode of the SHDMIM capacitor 395, the conductive layer 810 is electrically connected to the TSV 571. Since the TSV 571 is connected to the conductive pad 550, and the TSV 581 is connected to the conductive pad 560, and the conductive pads 550 and 560 are bonded together, the conductive layers 810 and 710 are also electrically coupled together. As such, the SHDMIM capacitor 395 and the SHDMIM capacitor 495 are electrically coupled together in parallel.

One benefit offered by the parallel coupling of the SHDMIM capacitors 395 and 495 is increased capacitance. For example, if the SHDMIM capacitors 395 and 495 each offer a capacitance value of C1, then the collective capacitance value offered by the parallelly coupled SHDMIM capacitors 395 and 495 is approximately C2=2*C1. Note that the collective capacitance value C2 is not limited to 2*C1 but may be flexibly configured by adjusting the capacitance value of either the SHDMIM capacitor 395 or the capacitance value of the SHDMIM capacitor 495. Again, it is understood that other SHDMIM capacitors (which may include TSVs similar to the TSVs 571 and 581) similar to the SHDMIM capacitor 495 may be formed embedded in the passivation film 450. For example, one or more additional SHDMIM capacitor 495 may be formed to the "left" or to the "right" of the SHDMIM capacitors 495, and these SHDMIM capacitors are still embedded in the passivation film 450 and are electrically connected to conductive structures that are similar to the conductive pad 491 and the TSVs 571 and 581. For reasons of simplicity, however, these additional SHDMIM capacitors are not specifically illustrated herein.

Figure 23:
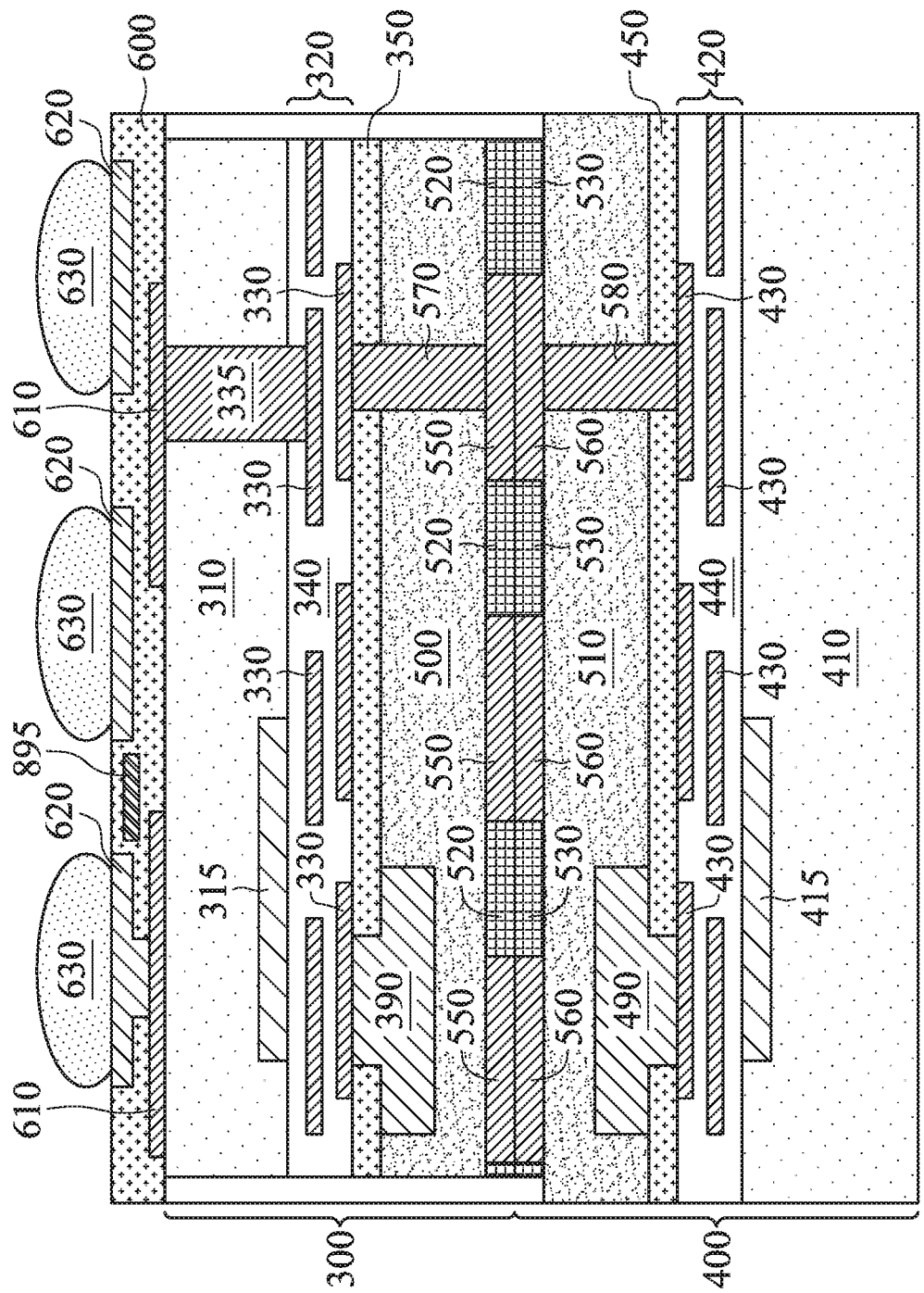

FIG. 23 illustrates yet another embodiment of a packaging scheme involving a SHDMIM. Again, for reasons of clarity and consistency, similar components appearing in FIGS. 17-22 will be labeled the same in FIG. 23. One difference between the embodiment shown in FIG. 23 and the embodiments shown in FIGS. 17-22 is that the SHDMIM capacitor 895 is implemented in the dielectric layer 600, rather than in the passivation films 350 or 450. The SHDMIM capacitor 895 may also be formed in a passivation film formed above or below the dielectric layer 600. Such a passivation film may be similar to the passivation films 350 or 450 and may include a plurality of passivation film layers. The configuration of the conductive layers and dielectric layers of the SHDMIM capacitor 895 may be substantially similar to the SHDMIM capacitor 495 shown in FIG. 18. In some embodiments, at least one of the electrodes of the SHDMIM capacitor 895 may be electrically coupled to one of the conductive bumps 630. Therefore, the conductive bumps 630 may also serve as control terminals of the SHDMIM capacitor 895.

Figure 24:
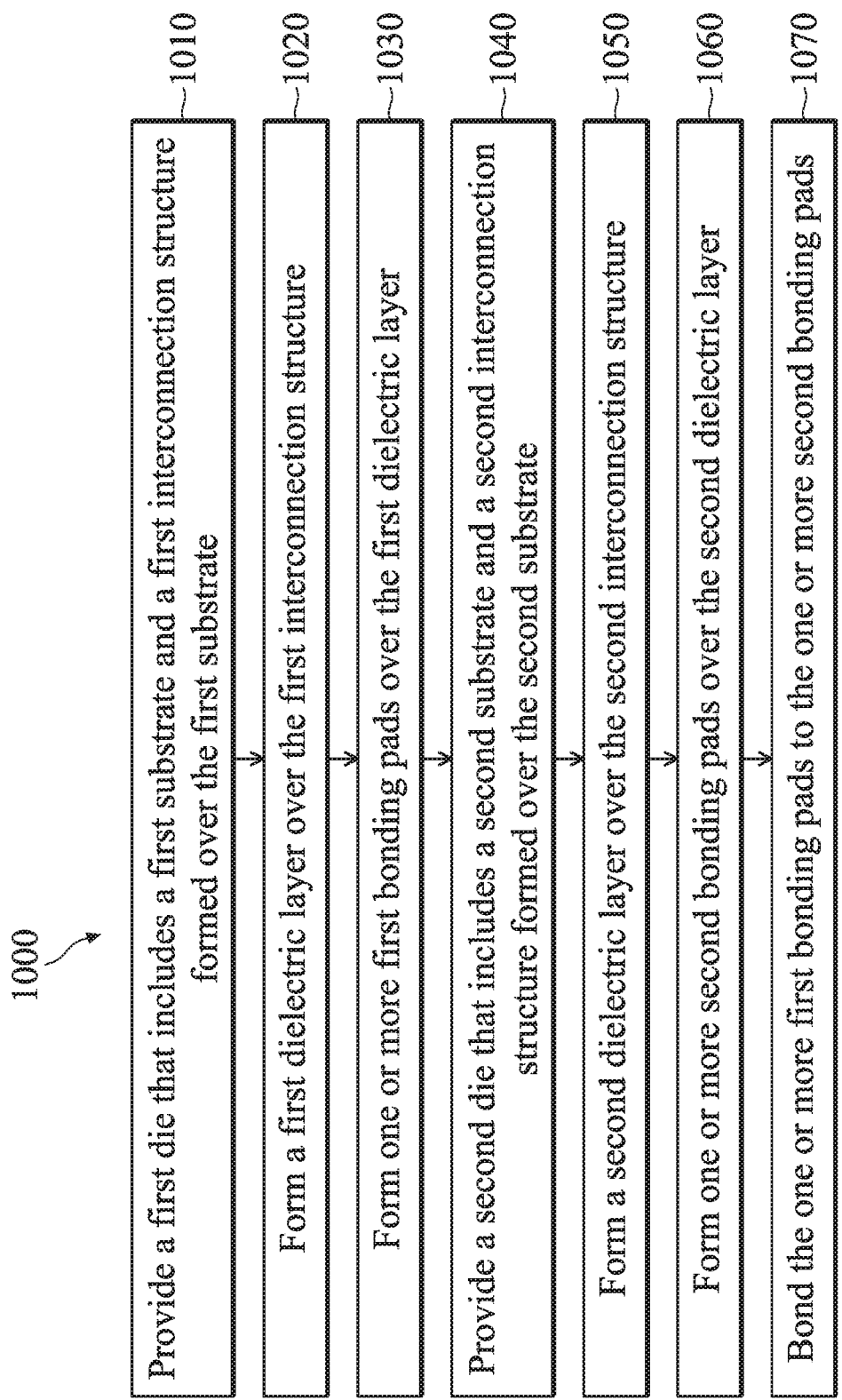
FIG. 24 is a flowchart of a method to fabricate an IC device in accordance with an embodiment of the present disclosure.

FIG. 24 is a flowchart illustrating a method 1000 according to an embodiment of the present disclosure. The method 1000 includes a step 1010 of providing a first die that includes a first substrate and a first interconnection structure formed over the first substrate. In some embodiments, the providing the first die includes providing a first wafer that contains the first die.

The method 1000 includes a step 1020 of forming a first dielectric layer over the first interconnection structure.

The method 1000 includes a step 1030 of forming one or more first bonding pads over the first dielectric layer.

The method 1000 includes a step 1040 of providing a second die that includes a second substrate and a second interconnection structure formed over the second substrate. In some embodiments, the providing the second die includes providing a second wafer that contains the second die.

The method 1000 includes a step 1050 of forming a second dielectric layer over the second interconnection structure.

The method 1000 includes a step 1060 of forming one or more second bonding pads over the second dielectric layer.

The method 1000 includes a step 1070 of bonding the one or more first bonding pads to the one or more second bonding pads.

At least one of the first die or the second die includes a metal-insulator-metal (MIM) capacitor embedded therein. In some embodiments, the MIM capacitor includes: a first conductive layer, a first dielectric material formed over the first conductive layer, a second conductive layer formed over the first dielectric material, a second dielectric material formed over the second conductive layer, and a third conductive layer formed over the second dielectric material.

It is understood that additional processes may be performed before, during, or after the steps 1010-1070 of the method 1000. For example, the method 1000 may include a step of forming the MIM capacitor in the first die or in the second die. As another example, the method 1000 may include a step of electrically coupling the first conductive layer and the third conductive layer with a first conductive component of the first die or of the second die, and a step of electrically coupling the second conductive layer with a second conductive component of the first die or of the second die. The second conductive component is different from the first conductive component. As yet another example, the method 1000 may include a step of forming a first MIM capacitor in the first die and forming a second MIM capacitor in the second die, and a step of electrically coupling the first MIM capacitor and the second MIM capacitor together in parallel. As a further example, the method 1000 may include a step of singulating the first wafer and singulating the second wafer before the bonding step of 1070. For reasons of simplicity, other additional steps are not discussed herein in detail.

In summary, the present disclosure involves a packaging scheme in which a SHDMIM capacitor is embedded in a three-dimensional IC structure. For example, the three-dimension IC structure may include two dies that are bonded together, where a TSV may be used to provide electrical connectivity between the components of the two bonded dies. The SHDMIM capacitor may be embedded in either, or both, of the bonded dies. In some embodiments, the SHDMIM capacitor may be embedded in both of the bonded dies and may be electrically coupled together in parallel. In other embodiments, the SHDMIM capacitor may be embedded in a dielectric layer beneath (or otherwise located adjacent to) the conductive bumps.

Based on the above discussions, it can be seen that the present disclosure offers advantages over conventional FinFET devices. It is understood, however, that other embodiments may offer additional advantages, and not all advantages are necessarily disclosed herein, and that no particular advantage is required for all embodiments. One advantage is that the SHDMIM capacitor offers flexibility in tuning a desired capacitance value, since its multiple plates and multiple dielectric layers allow for extra capacitance tuning parameters (or degrees of freedom). Another advantage is that the embedding of the SHDMIM capacitor within a passivation film means that no extra chip real estate is needed. Yet another advantage is the increased capacitance value achievable, since a SHDMIM capacitor may be implemented in each of the bonded dies. Yet another advantage is that different types of conductive components of the dies—such as bonding pads, TSVs, metal lines, etc.—may all be used as the control terminals of the SHDMIM capacitor, which enables easy electrical access of the SHDMIM herein. Other advantages include compatibility with existing fabrication and/or packaging processes, so the present disclosure does not require additional processing and is therefore easy and cheap to implement.

Thus, the present disclosure provides a device. The device includes a first die and a second die. The first die includes: a first substrate that contains first electrical circuitry, a first interconnection structure disposed over the first substrate, a first dielectric layer disposed over the first interconnection structure, and a plurality of first bonding pads disposed over the first dielectric layer. The second die includes: a second substrate that contains second electrical circuitry, a second interconnection structure disposed over the second substrate, a second dielectric layer disposed over the second interconnection structure, and a plurality of second bonding pads disposed over the second dielectric layer. The first bonding pads of the first die are bonded to the second bonding pads of the second die. At least one of the first die or the second die includes a metal-insulator-metal (MIM) capacitor. The MIM capacitor includes more than two metal layers that are stacked over one another.

The present disclosure also provides a device. The device includes a first die and a second die that are bonded together through a plurality of bonding pads. The device includes a capacitor embedded in at least one of the first die or the second die. The capacitor includes more than two metal layers. A first subset of the metal layers is electrically and physically connected to a first conductive component. A second subset of the metal layers is electrically and physically connected to a second conductive component different from the first conductive component.

The present disclosure further provides a method. A first die is provided that includes a first substrate and a first interconnection structure formed over the first substrate. A first dielectric layer is formed over the first interconnection structure. One or more first bonding pads are formed over the first dielectric layer. A second die is provided that includes a second substrate and a second interconnection structure formed over the second substrate. A second dielectric layer is formed over the second interconnection structure. One or more second bonding pads is formed over the second dielectric layer. The one or more first bonding pads are bonded to the one or more second bonding pads. At least one of the first die or the second die includes a metal-insulator-metal (MIM) capacitor embedded therein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
   a first die that includes: a first substrate that contains first electrical circuitry, a first interconnection structure disposed over the first substrate, a first dielectric layer disposed over the first interconnection structure, and a plurality of first bonding pads disposed over the first dielectric layer; and
   a second die that includes: a second substrate that contains second electrical circuitry, a second interconnection structure disposed over the second substrate, a second dielectric layer disposed over the second interconnection structure, and a plurality of second bonding pads disposed over the second dielectric layer;
   wherein:
   the first bonding pads of the first die are bonded to the second bonding pads of the second die;
   at least one of the first die or the second die includes a metal-insulator-metal (MIM) capacitor;
   the first dielectric layer or the second dielectric layer includes a passivation film; and
   the MIM capacitor is embedded within the passivation film and includes more than two metal layers that are stacked over one another.

2. The device of claim 1, wherein: the more than two metal layers of the MIM capacitor include a first metal layer, a first dielectric material disposed over the first metal layer, a second metal layer disposed over the first dielectric material, a second dielectric material disposed over the second metal layer, and a third metal layer disposed over the second dielectric material.

3. The device of claim 2, wherein: the second metal layer is disposed over a portion of, but not all of, the first metal layer.

4. The device of claim 2, wherein:
   the first die or the second die includes a first conductive pad and a second conductive pad;
   the first metal layer and the third metal layer of the MIM capacitor are both electrically coupled to the first conductive pad; and
   the second metal layer of the MIM capacitor is electrically coupled to the second conductive pad.

5. The device of claim 2, wherein:
the first die or the second die includes a conductive pad and a through substrate via (TSV);
the first metal layer and the third metal layer of the MIM capacitor are both electrically coupled to the conductive pad; and
the second metal layer of the MIM capacitor is electrically coupled to the TSV.

6. The device of claim 2, wherein:
the MIM capacitor is a first MIM capacitor that is embedded within the first die;
the second die includes a second MIM capacitor that includes a fourth metal layer, a fifth metal layer disposed over the fourth metal layer, and a sixth metal layer disposed over the fifth metal layer; and
the first MIM capacitor and the second MIM capacitor are electrically coupled together in parallel.

7. The device of claim 6, wherein:
the first die further includes a first conductive pad and a first through substrate via (TSV);
the second die further includes a second conductive pad and a second TSV;
the first metal layer and the third metal layer of the first MIM capacitor are both electrically coupled to the first conductive pad;
the second metal layer of the first MIM capacitor is electrically coupled to the first TSV;
the fourth metal layer and the sixth metal layer of the second MIM capacitor are both electrically coupled to the second conductive pad;
the fifth metal layer of the second MIM capacitor is electrically coupled to the second TSV; and
the first TSV and the second TSV are electrically coupled together.

8. The device of claim 1, further including:
a third dielectric layer disposed over the first substrate, wherein the third dielectric layer and the first interconnection structure are disposed on opposite sides of the first substrate; and
a plurality of conductive bumps disposed over the third dielectric layer;
wherein the MIM capacitor is embedded within the third dielectric layer.

9. A device, comprising:
a first die and a second die bonded together through a plurality of bonding pads; and
a capacitor embedded in at least one of the first die or the second die;
wherein:
the capacitor includes more than two metal layers;
a first subset of the more than two metal layers is electrically and physically connected to a first conductive component that is located to a first side of the capacitor laterally; and
a second subset of the more than two metal layers is electrically and physically connected to a second conductive component different from the first conductive component, wherein the second conductive component is located to a second side of the capacitor laterally, the second side being opposite the first side.

10. The device of claim 9, wherein at least one of the first conductive component or the second conductive component includes a conductive pad.

11. The device of claim 9, wherein at least one of the first conductive component or the second conductive component includes a through substrate via (TSV).

12. The device of claim 9, wherein the capacitor is embedded in a passivation film of the first die or a passivation film of the second die.

13. The device of claim 9, wherein the first subset and the second subset of the metal layers are mutually exclusive from one another.

14. The device of claim 9, wherein:
the capacitor is a first capacitor embedded in the first die;
the device further includes a second capacitor embedded in the second die; and
the first capacitor is electrically coupled to the second capacitor in parallel.

15. The device of claim 9, wherein:
the more than two metal layers includes a first metal layer, a second metal layer disposed over the first metal layer, and a third metal layer disposed over the second metal layer; and
the capacitor further includes: a first dielectric layer disposed between the first metal layer and the second metal layer, and a second dielectric layer disposed between the second metal layer and the third metal layer.

16. The device of claim 15, wherein:
a bottom surface of the second metal layer is elevated at different vertical levels; and
a bottom surface of the third metal layer is elevated at different vertical levels.

17. A method, comprising:
providing a first die that includes a first substrate and a first interconnection structure formed over the first substrate;
forming a first dielectric layer over the first interconnection structure;
forming one or more first bonding pads over the first dielectric layer;
providing a second die that includes a second substrate and a second interconnection structure formed over the second substrate;
forming a second dielectric layer over the second interconnection structure;
forming one or more second bonding pads over the second dielectric layer; and
bonding the one or more first bonding pads to the one or more second bonding pads;
wherein at least one of the first die or the second die includes a metal-insulator-metal (MIM) capacitor embedded therein, and wherein the MIM capacitor includes: a first conductive layer, a first dielectric material formed over the first conductive layer, a second conductive layer formed over the first dielectric material, a second dielectric material formed over the second conductive layer, and a third conductive layer formed over the second dielectric material.

18. The method of claim 17, further comprising:
electrically coupling the first conductive layer and the third conductive layer with a first conductive component of the first die or of the second die; and
electrically coupling the second conductive layer with a second conductive component of the first die or of the second die, wherein the second conductive component is different from the first conductive component.

19. The method of claim 17, further comprising:
forming a first MIM capacitor as a first instance of the MIM capacitor in the first die and forming a second MIM capacitor as a second instance of the MIM capacitor in the second die; and electrically coupling the first MIM capacitor and the second MIM capacitor together in parallel.

20. The method of claim 17, wherein the providing the first die includes providing a first wafer that contains the first die, wherein the providing the second die includes providing a second wafer that includes the second die, and wherein the method further includes: singulating the first wafer and singulating the second wafer before the bonding.

* * * * *